United States Patent
Ellis et al.

(10) Patent No.: US 9,485,851 B2
(45) Date of Patent: Nov. 1, 2016

(54) THERMAL TUBE ASSEMBLY STRUCTURES

(71) Applicant: SanDisk Enterprise IP LLC, Milpitas, CA (US)

(72) Inventors: Robert W. Ellis, Phoenix, AZ (US); David Dean, Litchfield Park, AZ (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/244,745

(22) Filed: Apr. 3, 2014

(65) Prior Publication Data
US 2015/0264834 A1    Sep. 17, 2015

Related U.S. Application Data

(60) Provisional application No. 61/953,696, filed on Mar. 14, 2014.

(51) Int. Cl.
*H05K 1/02* (2006.01)
*H05K 1/14* (2006.01)
*G06F 1/18* (2006.01)
(Continued)

(52) U.S. Cl.
CPC .............. *H05K 1/0203* (2013.01); *G06F 1/187* (2013.01); *G06F 1/203* (2013.01); *H05K 1/144* (2013.01); *H05K 7/20145* (2013.01)

(58) Field of Classification Search
CPC ..................... H05K 7/20127; H05K 7/20145; G06F 1/187; G02F 2201/36
See application file for complete search history.

(56) References Cited

U.S. PATENT DOCUMENTS 4,839,587 A    6/1989  Flatley et al.
4,916,652 A    4/1990  Schwarz et al.
5,210,680 A *  5/1993  Scheibler ........... H05K 7/20581
                                                    165/80.3

(Continued)

FOREIGN PATENT DOCUMENTS

CN    201 655 782    11/2010
CN    102 446 873     5/2012

(Continued)

OTHER PUBLICATIONS

Invitation to Pay Additional Fees dated Jul. 25, 2014, received in International Patent Application No. PCT/US2014/021290, which corresponds to U.S. Appl. No. 13/791,797, 8 pages (Dean).

(Continued)

*Primary Examiner* — David M Sinclair
*Assistant Examiner* — Robert Brown
(74) *Attorney, Agent, or Firm* — Morgan, Lewis & Bockius LLP

(57) ABSTRACT

Various embodiments described herein disclose systems, methods and/or devices used to dissipate heat generated by electronic components of an electronic assembly that further includes a first assembly rail, a top circuit board and a bottom circuit board. The first assembly rail includes a first card guide structure and a second card guide structure that are arranged on a first side of the first assembly rail near two opposite ends of the assembly rail. The top and the bottom circuit boards are mechanically coupled to the first and second card guide structures of the first assembly rail, respectively. The top circuit board is parallel to the bottom circuit board, and separated from the bottom circuit board by a predefined distance. The first assembly rail, the top circuit board and the bottom circuit board together form a channel there between for receiving a heat dissipating airflow.

20 Claims, 7 Drawing Sheets

(51) Int. Cl.
  *G06F 1/20* (2006.01)
  *H05K 7/20* (2006.01)

(56) References Cited

U.S. PATENT DOCUMENTS

| | | | |
|---|---|---|---|
| 5,489,805 A | 2/1996 | Hackitt et al. | |
| 5,519,847 A | 5/1996 | Fandrich et al. | |
| 5,530,705 A | 6/1996 | Malone | |
| 5,537,555 A | 7/1996 | Landry | |
| 5,551,003 A | 8/1996 | Mattson et al. | |
| 5,628,031 A | 5/1997 | Kikinis et al. | |
| 5,657,332 A | 8/1997 | Auclair et al. | |
| 5,666,114 A | 9/1997 | Brodie et al. | |
| 5,705,850 A | 1/1998 | Ashiwake et al. | |
| 5,708,849 A | 1/1998 | Coke et al. | |
| 5,763,950 A | 6/1998 | Fujisaki et al. | |
| 5,828,549 A | 10/1998 | Gandre et al. | |
| 5,923,532 A * | 7/1999 | Nedved | H05K 7/1418 211/41.17 |
| 5,943,692 A | 8/1999 | Marberg et al. | |
| 5,946,190 A | 8/1999 | Patel et al. | |
| 5,973,920 A | 10/1999 | Altic et al. | |
| 5,982,664 A | 11/1999 | Watanabe | |
| 6,000,006 A | 12/1999 | Bruce et al. | |
| 6,008,987 A | 12/1999 | Gale et al. | |
| 6,009,938 A | 1/2000 | Smith et al. | |
| 6,016,560 A | 1/2000 | Wada et al. | |
| 6,018,304 A | 1/2000 | Bessios | |
| 6,031,730 A | 2/2000 | Kroske | |
| 6,058,012 A | 5/2000 | Cooper et al. | |
| 6,061,245 A | 5/2000 | Ingraham et al. | |
| 6,070,074 A | 5/2000 | Perahia et al. | |
| 6,084,773 A | 7/2000 | Nelson et al. | |
| 6,138,261 A | 10/2000 | Wilcoxson et al. | |
| 6,182,264 B1 | 1/2001 | Ott | |
| 6,192,092 B1 | 2/2001 | Dizon et al. | |
| 6,295,592 B1 | 9/2001 | Jeddeloh et al. | |
| 6,311,263 B1 | 10/2001 | Barlow et al. | |
| 6,335,862 B1 | 1/2002 | Koya | |
| 6,411,511 B1 * | 6/2002 | Chen | G06F 1/20 165/104.33 |
| 6,442,076 B1 | 8/2002 | Roohparvar | |
| 6,449,625 B1 | 9/2002 | Wang | |
| 6,484,224 B1 | 11/2002 | Robins et al. | |
| 6,507,101 B1 | 1/2003 | Morris | |
| 6,516,437 B1 | 2/2003 | Van Stralen et al. | |
| 6,528,878 B1 | 3/2003 | Daikoku et al. | |
| 6,541,310 B1 | 4/2003 | Lo et al. | |
| 6,570,762 B2 * | 5/2003 | Cross | H04Q 1/09 361/676 |
| 6,618,249 B2 | 9/2003 | Fairchild | |
| 6,621,705 B1 | 9/2003 | Ballenger et al. | |
| 6,678,788 B1 | 1/2004 | O'Connell | |
| 6,757,768 B1 | 6/2004 | Potter et al. | |
| 6,762,942 B1 * | 7/2004 | Smith | H05K 1/189 174/258 |
| 6,775,792 B2 | 8/2004 | Ulrich et al. | |
| 6,810,440 B2 | 10/2004 | Micalizzi, Jr. et al. | |
| 6,836,808 B2 | 12/2004 | Bunce et al. | |
| 6,836,815 B1 | 12/2004 | Purcell et al. | |
| 6,842,436 B2 | 1/2005 | Moeller | |
| 6,871,257 B2 | 3/2005 | Conley et al. | |
| 6,892,801 B1 | 5/2005 | Kim | |
| 6,895,464 B2 | 5/2005 | Chow et al. | |
| 6,934,152 B1 * | 8/2005 | Barrow | H05K 7/1461 165/80.3 |
| 6,978,343 B1 | 12/2005 | Ichiriu | |
| 6,980,985 B1 | 12/2005 | Amer-Yahia et al. | |
| 6,981,205 B2 | 12/2005 | Fukushima et al. | |
| 6,988,171 B2 | 1/2006 | Beardsley et al. | |
| 6,997,720 B2 | 2/2006 | Perret et al. | |
| 7,020,017 B2 | 3/2006 | Chen et al. | |
| 7,030,482 B2 | 4/2006 | Haines | |
| 7,032,123 B2 | 4/2006 | Kane et al. | |
| 7,043,505 B1 | 5/2006 | Teague et al. | |
| 7,075,788 B2 * | 7/2006 | Larson | G06F 1/20 165/185 |
| 7,079,972 B1 | 7/2006 | Wood et al. | |
| 7,100,002 B2 | 8/2006 | Shrader et al. | |
| 7,111,293 B1 | 9/2006 | Hersh et al. | |
| 7,162,678 B2 | 1/2007 | Saliba | |
| 7,173,852 B2 | 2/2007 | Gorobets et al. | |
| 7,184,446 B2 | 2/2007 | Rashid et al. | |
| 7,233,501 B1 * | 6/2007 | Ingalz | H01L 23/367 257/E23.102 |
| 7,280,364 B2 | 10/2007 | Harris et al. | |
| 7,328,377 B1 | 2/2008 | Lewis et al. | |
| 7,474,528 B1 | 1/2009 | Olesiewicz | |
| 7,480,147 B2 * | 1/2009 | Hoss | G06F 1/20 361/715 |
| 7,516,292 B2 | 4/2009 | Kimura et al. | |
| 7,523,157 B2 | 4/2009 | Aguilar, Jr. et al. | |
| 7,527,466 B2 | 5/2009 | Simmons | |
| 7,529,466 B2 | 5/2009 | Takahashi | |
| 7,571,277 B2 | 8/2009 | Mizushima | |
| 7,574,554 B2 | 8/2009 | Tanaka et al. | |
| 7,595,994 B1 * | 9/2009 | Sun | G06F 1/20 248/247 |
| 7,596,643 B2 | 9/2009 | Merry et al. | |
| 7,599,182 B2 | 10/2009 | Sun | |
| 7,623,343 B2 * | 11/2009 | Chen | G06F 1/186 361/679.32 |
| 7,681,106 B2 | 3/2010 | Jarrar et al. | |
| 7,685,494 B1 | 3/2010 | Varnica et al. | |
| 7,707,481 B2 | 4/2010 | Kirschner et al. | |
| 7,761,655 B2 | 7/2010 | Mizushima et al. | |
| 7,774,390 B2 | 8/2010 | Shin | |
| 7,840,762 B2 | 11/2010 | Oh et al. | |
| 7,870,326 B2 | 1/2011 | Shin et al. | |
| 7,890,818 B2 | 2/2011 | Kong et al. | |
| 7,913,022 B1 | 3/2011 | Baxter | |
| 7,925,960 B2 | 4/2011 | Ho et al. | |
| 7,934,052 B2 | 4/2011 | Prins et al. | |
| 7,954,041 B2 | 5/2011 | Hong et al. | |
| 7,959,445 B1 | 6/2011 | Daily et al. | |
| 7,961,462 B2 | 6/2011 | Hernon | |
| 7,971,112 B2 | 6/2011 | Murata | |
| 7,974,368 B2 | 7/2011 | Shieh et al. | |
| 7,978,516 B2 | 7/2011 | Olbrich | |
| 7,980,863 B1 | 7/2011 | Holec et al. | |
| 7,989,709 B2 | 8/2011 | Tsao | |
| 7,996,642 B1 | 8/2011 | Smith | |
| 8,000,096 B2 | 8/2011 | Nemoz et al. | |
| 8,006,161 B2 | 8/2011 | Lestable et al. | |
| 8,032,724 B1 | 10/2011 | Smith | |
| 8,069,390 B2 | 11/2011 | Lin | |
| 8,190,967 B2 | 5/2012 | Hong et al. | |
| 8,198,539 B2 | 6/2012 | Otoshi et al. | |
| 8,208,252 B2 * | 6/2012 | Tolliver | G06F 1/20 136/205 |
| 8,254,181 B2 | 8/2012 | Hwang et al. | |
| 8,305,103 B2 | 11/2012 | Kang et al. | |
| 8,312,349 B2 | 11/2012 | Reche et al. | |
| 8,373,986 B2 | 2/2013 | Sun | |
| 8,405,985 B1 * | 3/2013 | Reynov | H05K 7/20736 361/688 |
| 8,412,985 B1 | 4/2013 | Bowers et al. | |
| 8,472,183 B1 * | 6/2013 | Ross | H05K 7/1492 361/679.48 |
| 8,477,495 B2 | 7/2013 | Sun | |
| 8,570,740 B2 | 10/2013 | Cong et al. | |
| 9,089,075 B2 * | 7/2015 | Reynov | H05K 7/20736 |
| 2002/0008963 A1 | 1/2002 | DiBene, II et al. | |
| 2002/0024846 A1 | 2/2002 | Kawahara et al. | |
| 2002/0076951 A1 | 6/2002 | Roy | |
| 2002/0083299 A1 | 6/2002 | Van Huben et al. | |
| 2002/0123259 A1 | 9/2002 | Yatskov et al. | |
| 2002/0152305 A1 | 10/2002 | Jackson et al. | |
| 2002/0162075 A1 | 10/2002 | Talagala et al. | |
| 2002/0165896 A1 | 11/2002 | Kim | |
| 2003/0041299 A1 | 2/2003 | Kanazawa et al. | |
| 2003/0043829 A1 | 3/2003 | Rashid | |
| 2003/0088805 A1 | 5/2003 | Majni et al. | |
| 2003/0093628 A1 | 5/2003 | Matter et al. | |

(56) References Cited

U.S. PATENT DOCUMENTS

| | | | |
|---|---|---|---|
| 2003/0184970 A1* | 10/2003 | Bosch | H01L 23/367 361/688 |
| 2003/0188045 A1 | 10/2003 | Jacobson | |
| 2003/0189856 A1 | 10/2003 | Cho et al. | |
| 2003/0198100 A1 | 10/2003 | Matsushita et al. | |
| 2003/0212719 A1 | 11/2003 | Yasuda et al. | |
| 2004/0024957 A1 | 2/2004 | Lin et al. | |
| 2004/0024963 A1 | 2/2004 | Talagala et al. | |
| 2004/0073829 A1 | 4/2004 | Olarig | |
| 2004/0153902 A1 | 8/2004 | Machado et al. | |
| 2004/0181734 A1 | 9/2004 | Saliba | |
| 2004/0199714 A1 | 10/2004 | Estakhri et al. | |
| 2004/0218367 A1 | 11/2004 | Lin et al. | |
| 2004/0237018 A1 | 11/2004 | Riley | |
| 2004/0246662 A1 | 12/2004 | Thurk et al. | |
| 2005/0009382 A1 | 1/2005 | Burmeister et al. | |
| 2005/0013120 A1* | 1/2005 | Liu | H01L 23/3675 361/707 |
| 2005/0060456 A1 | 3/2005 | Shrader et al. | |
| 2005/0060501 A1 | 3/2005 | Shrader | |
| 2005/0082663 A1 | 4/2005 | Wakiyama et al. | |
| 2005/0114587 A1 | 5/2005 | Chou et al. | |
| 2005/0152112 A1 | 7/2005 | Holmes et al. | |
| 2005/0172065 A1 | 8/2005 | Keays | |
| 2005/0172207 A1 | 8/2005 | Radke et al. | |
| 2005/0193161 A1 | 9/2005 | Lee et al. | |
| 2005/0201148 A1 | 9/2005 | Chen et al. | |
| 2005/0231765 A1 | 10/2005 | So et al. | |
| 2005/0257120 A1 | 11/2005 | Gorobets et al. | |
| 2005/0273560 A1 | 12/2005 | Hulbert et al. | |
| 2005/0289314 A1 | 12/2005 | Adusumilli et al. | |
| 2006/0039196 A1 | 2/2006 | Gorobets et al. | |
| 2006/0042291 A1 | 3/2006 | Petroski | |
| 2006/0053246 A1 | 3/2006 | Lee | |
| 2006/0067066 A1* | 3/2006 | Meier | G06F 1/184 361/785 |
| 2006/0085671 A1 | 4/2006 | Majni et al. | |
| 2006/0133041 A1 | 6/2006 | Belady et al. | |
| 2006/0136570 A1 | 6/2006 | Pandya | |
| 2006/0156177 A1 | 7/2006 | Kottapalli et al. | |
| 2006/0195650 A1 | 8/2006 | Su et al. | |
| 2006/0259528 A1 | 11/2006 | Dussud et al. | |
| 2007/0001282 A1 | 1/2007 | Kang et al. | |
| 2007/0011413 A1 | 1/2007 | Nonaka et al. | |
| 2007/0057686 A1 | 3/2007 | Suga et al. | |
| 2007/0058446 A1 | 3/2007 | Hwang et al. | |
| 2007/0061597 A1 | 3/2007 | Holtzman et al. | |
| 2007/0074850 A1 | 4/2007 | Peschl | |
| 2007/0076479 A1 | 4/2007 | Kim et al. | |
| 2007/0081408 A1 | 4/2007 | Kwon et al. | |
| 2007/0083697 A1 | 4/2007 | Birrell et al. | |
| 2007/0097653 A1 | 5/2007 | Gilliland et al. | |
| 2007/0113019 A1 | 5/2007 | Beukema | |
| 2007/0121297 A1 | 5/2007 | Uchizono et al. | |
| 2007/0133312 A1 | 6/2007 | Roohparvar | |
| 2007/0145996 A1 | 6/2007 | Shiao et al. | |
| 2007/0147113 A1 | 6/2007 | Mokhlesi et al. | |
| 2007/0150790 A1 | 6/2007 | Gross et al. | |
| 2007/0157064 A1 | 7/2007 | Falik et al. | |
| 2007/0174579 A1 | 7/2007 | Shin | |
| 2007/0180188 A1 | 8/2007 | Fujbayashi et al. | |
| 2007/0208901 A1 | 9/2007 | Purcell et al. | |
| 2007/0211426 A1 | 9/2007 | Clayton et al. | |
| 2007/0211436 A1 | 9/2007 | Robinson et al. | |
| 2007/0216005 A1 | 9/2007 | Yim et al. | |
| 2007/0216009 A1 | 9/2007 | Ng | |
| 2007/0230111 A1* | 10/2007 | Starr | H05K 7/1487 361/679.31 |
| 2007/0234143 A1 | 10/2007 | Kim | |
| 2007/0245061 A1 | 10/2007 | Harriman | |
| 2007/0246189 A1 | 10/2007 | Lin et al. | |
| 2007/0247805 A1* | 10/2007 | Fujie | G11B 33/142 361/679.49 |
| 2007/0277036 A1 | 11/2007 | Chamberlain et al. | |
| 2007/0291556 A1 | 12/2007 | Kamei | |
| 2007/0294496 A1 | 12/2007 | Goss et al. | |
| 2007/0300130 A1 | 12/2007 | Gorobets | |
| 2008/0019095 A1 | 1/2008 | Liu | |
| 2008/0019182 A1 | 1/2008 | Yanagidaira et al. | |
| 2008/0022163 A1 | 1/2008 | Tanaka et al. | |
| 2008/0026637 A1 | 1/2008 | Minich | |
| 2008/0043435 A1 | 2/2008 | Yip et al. | |
| 2008/0052435 A1* | 2/2008 | Norwood | H05K 7/1478 710/301 |
| 2008/0052446 A1 | 2/2008 | Lasser et al. | |
| 2008/0068796 A1 | 3/2008 | Pav et al. | |
| 2008/0077841 A1 | 3/2008 | Gonzalez et al. | |
| 2008/0077937 A1 | 3/2008 | Shin et al. | |
| 2008/0086677 A1 | 4/2008 | Yang et al. | |
| 2008/0116571 A1 | 5/2008 | Dang et al. | |
| 2008/0144371 A1 | 6/2008 | Yeh et al. | |
| 2008/0147964 A1 | 6/2008 | Chow et al. | |
| 2008/0147998 A1 | 6/2008 | Jeong | |
| 2008/0148124 A1 | 6/2008 | Zhang et al. | |
| 2008/0158818 A1 | 7/2008 | Clidaras et al. | |
| 2008/0163030 A1 | 7/2008 | Lee | |
| 2008/0168191 A1 | 7/2008 | Biran et al. | |
| 2008/0168319 A1 | 7/2008 | Lee et al. | |
| 2008/0170460 A1 | 7/2008 | Oh et al. | |
| 2008/0229000 A1 | 9/2008 | Kim | |
| 2008/0229003 A1 | 9/2008 | Mizushima et al. | |
| 2008/0229176 A1 | 9/2008 | Arnez et al. | |
| 2008/0236791 A1* | 10/2008 | Wayman | H01L 23/3672 165/80.3 |
| 2008/0252324 A1 | 10/2008 | Barabi et al. | |
| 2008/0254573 A1 | 10/2008 | Sir et al. | |
| 2008/0266807 A1 | 10/2008 | Lakin et al. | |
| 2008/0270680 A1 | 10/2008 | Chang | |
| 2008/0282128 A1 | 11/2008 | Lee et al. | |
| 2008/0285351 A1 | 11/2008 | Shlick et al. | |
| 2008/0291636 A1 | 11/2008 | Mori et al. | |
| 2009/0003058 A1 | 1/2009 | Kang | |
| 2009/0037652 A1 | 2/2009 | Yu et al. | |
| 2009/0144598 A1 | 6/2009 | Yoon et al. | |
| 2009/0168525 A1 | 7/2009 | Olbrich et al. | |
| 2009/0172258 A1 | 7/2009 | Olbrich et al. | |
| 2009/0172259 A1 | 7/2009 | Prins et al. | |
| 2009/0172260 A1 | 7/2009 | Olbrich et al. | |
| 2009/0172261 A1 | 7/2009 | Prins et al. | |
| 2009/0172262 A1 | 7/2009 | Olbrich et al. | |
| 2009/0172308 A1 | 7/2009 | Prins et al. | |
| 2009/0172335 A1 | 7/2009 | Kulkarni et al. | |
| 2009/0172499 A1 | 7/2009 | Olbrich et al. | |
| 2009/0190308 A1 | 7/2009 | Bhattacharya et al. | |
| 2009/0193058 A1 | 7/2009 | Reid | |
| 2009/0207660 A1 | 8/2009 | Hwang et al. | |
| 2009/0222708 A1 | 9/2009 | Yamaga | |
| 2009/0228761 A1 | 9/2009 | Perlmutter et al. | |
| 2009/0273898 A1* | 11/2009 | Imsand | G06F 1/181 361/679.39 |
| 2009/0296466 A1 | 12/2009 | Kim et al. | |
| 2009/0296486 A1 | 12/2009 | Kim et al. | |
| 2009/0302458 A1 | 12/2009 | Kubo et al. | |
| 2009/0309214 A1* | 12/2009 | Szewerenko | H01L 23/467 257/707 |
| 2009/0319864 A1 | 12/2009 | Shrader | |
| 2010/0008034 A1* | 1/2010 | Hinkle | G06F 1/20 361/679.31 |
| 2010/0061151 A1 | 3/2010 | Miwa et al. | |
| 2010/0073860 A1 | 3/2010 | Moriai et al. | |
| 2010/0073880 A1 | 3/2010 | Liu | |
| 2010/0091463 A1 | 4/2010 | Buresch et al. | |
| 2010/0103737 A1 | 4/2010 | Park | |
| 2010/0118496 A1 | 5/2010 | Lo | |
| 2010/0161936 A1 | 6/2010 | Royer et al. | |
| 2010/0164525 A1 | 7/2010 | Han et al. | |
| 2010/0199125 A1 | 8/2010 | Reche | |
| 2010/0202196 A1 | 8/2010 | Lee et al. | |
| 2010/0208521 A1 | 8/2010 | Kim et al. | |
| 2010/0224985 A1 | 9/2010 | Michael et al. | |
| 2010/0262889 A1 | 10/2010 | Bains | |
| 2010/0281207 A1 | 11/2010 | Miller et al. | |
| 2010/0281342 A1 | 11/2010 | Chang et al. | |
| 2010/0296255 A1 | 11/2010 | Maloney | |

(56) References Cited

U.S. PATENT DOCUMENTS

| | | | |
|---|---|---|---|
| 2010/0319986 A1* | 12/2010 | Bleau | G06F 1/181 174/520 |
| 2010/0328887 A1 | 12/2010 | Refai-Ahmed et al. | |
| 2011/0083060 A1 | 4/2011 | Sakurada et al. | |
| 2011/0113281 A1 | 5/2011 | Zhang et al. | |
| 2011/0131444 A1 | 6/2011 | Buch et al. | |
| 2011/0132000 A1* | 6/2011 | Deane | G01R 31/2874 62/3.3 |
| 2011/0173378 A1 | 7/2011 | Filor et al. | |
| 2011/0182035 A1 | 7/2011 | Yajima | |
| 2011/0188205 A1 | 8/2011 | MacManus et al. | |
| 2011/0205823 A1 | 8/2011 | Hemink et al. | |
| 2011/0213920 A1 | 9/2011 | Frost et al. | |
| 2011/0228601 A1 | 9/2011 | Olbrich et al. | |
| 2011/0231600 A1 | 9/2011 | Tanaka et al. | |
| 2011/0299244 A1 | 12/2011 | Dede et al. | |
| 2011/0317359 A1* | 12/2011 | Wei | F15D 1/0005 361/690 |
| 2012/0014067 A1 | 1/2012 | Siracki | |
| 2012/0064781 A1 | 3/2012 | Krishnan et al. | |
| 2012/0096217 A1 | 4/2012 | Son et al. | |
| 2012/0110250 A1 | 5/2012 | Sabbag et al. | |
| 2012/0151253 A1 | 6/2012 | Horn | |
| 2012/0170224 A1* | 7/2012 | Fowler | H05K 7/1424 361/720 |
| 2012/0195126 A1 | 8/2012 | Roohparvar | |
| 2012/0201007 A1 | 8/2012 | Yeh et al. | |
| 2012/0239976 A1 | 9/2012 | Cometti et al. | |
| 2012/0284587 A1 | 11/2012 | Yu et al. | |
| 2012/0293962 A1 | 11/2012 | McCluskey et al. | |
| 2012/0327598 A1* | 12/2012 | Nakayama | G11B 33/142 361/692 |
| 2013/0155800 A1 | 6/2013 | Shim et al. | |
| 2013/0181733 A1 | 7/2013 | Kikuchi et al. | |
| 2013/0285686 A1* | 10/2013 | Malik | G01R 31/2875 324/750.05 |
| 2013/0294028 A1* | 11/2013 | Lafont | H05K 7/20127 361/694 |
| 2013/0307060 A1 | 11/2013 | Wang et al. | |
| 2014/0055944 A1* | 2/2014 | McCabe | G06F 1/187 361/679.39 |
| 2014/0071614 A1 | 3/2014 | Kaldani | |
| 2014/0153181 A1* | 6/2014 | Peng | H05K 7/1489 361/679.39 |
| 2014/0182814 A1* | 7/2014 | Lin | H05K 7/20145 165/80.2 |

FOREIGN PATENT DOCUMENTS

| | | |
|---|---|---|
| DE | 199 10 500 A1 | 10/2000 |
| DE | 2005 063281 | 7/2007 |
| EP | 0 600 590 A1 | 6/1994 |
| EP | 0 989 794 A2 | 3/2000 |
| EP | 1 465 203 A1 | 10/2004 |
| EP | 1 990 921 A2 | 11/2008 |
| EP | 2 066 158 A2 | 6/2009 |
| EP | 2 395 827 A2 | 12/2011 |
| EP | 2 600 700 A1 | 6/2013 |
| FR | 2560731 | 9/1985 |
| JP | 06006064 | 1/1994 |
| JP | 2002-532806 | 10/2002 |
| JP | 2003 188565 | 7/2003 |
| WO | WO 88 07193 | 3/1988 |
| WO | WO 03/094586 A1 | 11/2003 |
| WO | WO 2004/086827 A2 | 10/2004 |
| WO | WO 2007/036834 | 4/2007 |
| WO | WO 2007/080586 | 7/2007 |
| WO | WO 2008/013850 A2 | 1/2008 |
| WO | WO 2008/121553 | 10/2008 |
| WO | WO 2008/121577 | 10/2008 |
| WO | WO 2009/028281 | 3/2009 |
| WO | WO 2009/032945 | 3/2009 |
| WO | WO 2009/058140 | 5/2009 |
| WO | WO 2009/084724 | 7/2009 |
| WO | WO 2009/134576 | 11/2009 |
| WO | WO 2013/080341 | 6/2013 |

OTHER PUBLICATIONS

International Search Report and Written Opinion dated Sep. 12, 2014, received in International Patent Application No. PCT/US2014/043146.

International Search Report and Written Opinion dated May 18, 2015, received in International Patent Application No. PCT/US2015/016656, which corresponds to U.S. Appl. No. 14/275,690, 14 pages (Wright).

International Search Report and Written Opinion dated May 28, 2015, received in International Patent Application No. PCT/US2015/017729, which corresponds to U.S. Appl. No. 14/244,745, 14 pages (Ellis).

International Search Report and Written Opinion dated Apr. 28, 2015 received in International Patent Application No. PCT/US2015/014563, which corresponds to U.S. Appl. No. 14/179,247, 9 pages (Ellis).

International Search Report and Written Opinion dated May 8, 2015, received in International Patent Application No. PCT/US2015/017722, which corresponds to U.S. Appl. No. 14/277,716, 9 pages (Dean).

International Search Report and Written Opinion dated May 13, 2015, received in International Patent Application No. PCT/US2015/017724, which corresponds to U.S. Appl. No. 14/244,734, 12 pages, (Dean).

Barr, "Introduction to Watchdog Timers," Oct. 2001, 3 pgs.

Canim, "Buffered Bloom Filters on Solid State Storage," ADMS*10, Singapore, Sep. 13-17, 2010, 8 pgs.

Kang, "A Multi-Channel Architecture for High-Performance NAND Flash-Based Storage System," J. Syst. Archit., vol. 53, Issue 9, Sep. 2007, 15 pgs.

Kim, "A Space-Efficient Flash Translation Layer for CompactFlash Systems," May 2002, IEEE vol. 48, No. 2, 10 pgs.

Lu, "A Forest-structured Bloom Filter with Flash Memory," MSST 2011, Denver, CO, May 23-27, 2011, article, 6 pgs.

Lu, "A Forest-structured Bloom Filter with Flash Memory," MSST 2011, Denver, CO, May 23-27, 2011, presentation slides, 25 pgs.

McLean, "Information Technology—AT Attachment with Packet Interface Extension," Aug. 19, 1998, 339 pgs.

Microchip Technology, "Section 10. Watchdog Timer and Power-Saving Modes," 2005, 14 pages.

Park et al., "A High Performance Controller for NAND Flash-Based Solid State Disk (NSSD)," Proceedings of Non-Volatile Semiconductor Memory Workshop, Feb. 2006, 4 pgs.

Zeidman, "Verilog Designer's Library," 1999, 9 pgs.

International Search Report and Written Opinion, dated Mar. 19, 2009 received in International Patent Application No. PCT/US08/88133, which corresponds to U.S. Appl. No. 12/082,202, 7 pgs (Prins).

International Search Report and Written Opinion, dated Mar. 19, 2009 received in International Patent Application No. PCT/US08/88136, which corresponds to U.S. Appl. No. 12/082,205, 7 pgs (Olbrich).

International Search Report and Written Opinion dated Feb. 26, 2009, received in International Patent Application No. PCT/US08/88146, which corresponds to U.S. Appl. No. 12/082,221, 10 pgs (Prins).

International Search Report and Written Opinion dated Feb. 27, 2009, received in International Patent Application No. PCT/US2008/088154, which corresponds to U.S. Appl. No. 12/082,207, 8 pgs (Prins).

International Search Report and Written Opinion dated Feb. 13, 2009, received in International Patent Application No. PCT/US08/88164, which corresponds to U.S. Appl. No. 12/082,220, 6 pgs (Olbrich).

International Search Report and Written Opinion dated Feb. 18, 2009, received in International Patent Application No. PCT/US08/88206, which corresponds to U.S. Appl. No. 12/082,206, 8 pgs (Prins).

(56) References Cited

OTHER PUBLICATIONS

International Search Report and Written Opinion dated Feb. 19, 2009, received in International Patent Application No. PCT/US08/88217, which corresponds to U.S. Appl. No. 12/082,204, 7 pgs (Olbrich).
International Search Report and Written Opinion dated Feb. 13, 2009, received in International Patent Application No. PCT/US08/88229, which corresponds to U.S. Appl. No. 12/082,223, 7 pgs (Olbrich).
International Search Report and Written Opinion dated Feb. 19, 2009, received in International Patent Application No. PCT/US08/88232, which corresponds to U.S. Appl. No. 12/082,222, 8 pgs (Olbrich).
International Search Report and Written Opinion dated Feb. 19, 2009, received in International Patent Application No. PCT/US08/88236, which corresponds to U.S. Appl. No. 12/082,203, 7 pgs (Olbrich).
International Search Report and Written Opinion dated Oct. 27, 2011, received in International Patent Application No. PCT/US2011/028637, which corresponds to U.S. Appl. No. 12/726,200, 11 pgs (Olbrich).
European Search Report dated Feb. 23, 2012, received in European Patent Application No. 08866997.3, which corresponds to U.S. Appl. No. 12/082,207, 6 pgs (Prins).
Office Action dated Apr. 18, 2012, received in Chinese Patent Application No. 200880127623.8, which corresponds to U.S. Appl. No. 12/082,207, 12 pgs (Prins).
Office Action dated Dec. 31, 2012, received in Chinese Patent Application No. 200880127623.8, which corresponds to U.S. Appl. No. 12/082,207, 9 pgs (Prins).
Notification of the Decision to Grant a Patent Right for Patent for Invention dated Jul. 4, 2013, received in Chinese Patent Application No. 200880127623.8, which corresponds to U.S. Appl. No. 12/082,207, 1 pg (Prins).
Office Action dated Jul. 24, 2012, received in Japanese Patent Application No. JP 2010-540863, 3 pgs (Prins).
International Search Report and Written Opinion dated Mar. 7, 2014, received in International Patent Application No. PCT/US2013/074772, which corresponds to U.S. Appl. No. 13/831,218, 10 pages (George).
International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
International Search Report and Written Opinion dated Aug. 31, 2012, received in International Patent Application PCT/US2012/042764, which corresponds to U.S. Appl. No. 13/285,873, 12 pgs (Frayer).
International Search Report and Written Opinion dated Mar. 4, 2013, received in PCT/US2012/042771, which corresponds to U.S. Appl. No. 13/286,012, 14 pgs (Stonelake).
International Search Report and Written Opinion dated Sep. 26, 2012, received in International Patent Application No. PCT/US2012/042775, which corresponds to U.S. Appl. No. 13/285,892, 8 pgs (Weston-Lewis et al.).
International Search Report and Written Opinion dated Jun. 6, 2013, received in International Patent Application No. PCT/US2012/059447, which corresponds to U.S. Appl. No. 13/602,031, 12 pgs (Tai).
International Search Report and Written Opinion dated Jun. 6, 2013, received in International Patent Application No. PCT/US2012/059453, which corresponds to U.S. Appl. No. 13/602,039, 12 pgs (Frayer).
International Search Report and Written Opinion dated Feb. 14, 2013, received in International Patent Application No. PCT/US2012/059459, which corresponds to U.S. Appl. No. 13/602,047, 9 pgs (Tai).
International Search Report and Written Opinion dated May 23, 2013, received in International Patent Application No. PCT/US2012/065914, which corresponds to U.S. Appl. No. 13/679,963, 7 pgs (Frayer).
International Search Report and Written Opinion dated Apr. 5, 2013, received in International Patent Application No. PCT/US2012/065916, which corresponds to U.S. Appl. No. 13/679,969, 7 pgs (Frayer).
International Search Report and Written Opinion dated Jun. 17, 2013, received in International Patent Application No. PCT/US2012/065919, which corresponds to U.S. Appl. No. 13/679,970, 8 pgs (Frayer).
International Search Report and Written Opinion dated Dec. 16, 2014, received in International Patent Application No. PCT/US2014/059114, which corresponds to U.S. Appl. No. 14/135,223, 9 pages (Dean).
International Search Report and Written Opinion dated Nov. 20, 2014, received in International Patent Application No. PCT/US2014/020290, which corresponds to U.S. Appl. No. 13/791,797, 21 pages (Dean).
International Search Report and Written Opinion dated Dec. 23, 2014, received in International Patent Application No. PCT/US2014/042772, which corresponds to U.S. Appl. No. 13/922,105, 10 pages (Dean).

* cited by examiner

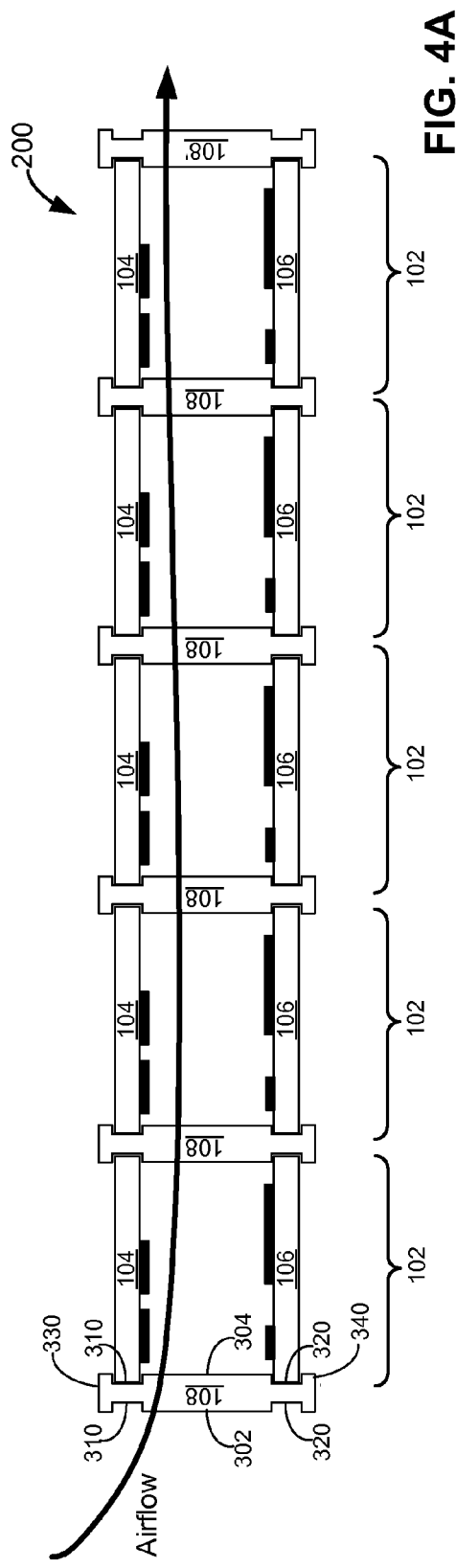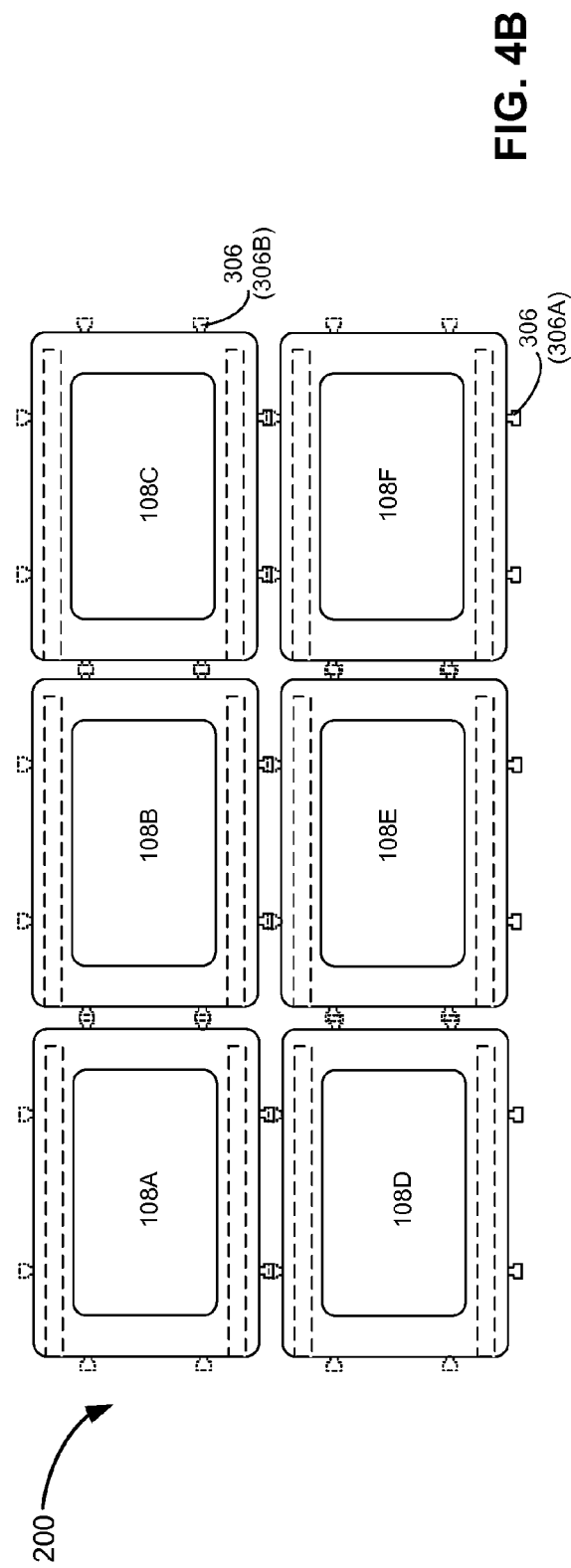

THERMAL TUBE ASSEMBLY STRUCTURES

RELATED APPLICATIONS

This application claims priority to U.S. Provisional Patent Application Ser. No. 61/953,696, filed Mar. 14, 2014, and titled "Thermal Tube Assembly Structures," which is incorporated herein by reference in its entirety.

TECHNICAL FIELD

The disclosed embodiments relate generally to heat management, and in particular, to dissipating heat generated by electronic components in electronic assemblies.

BACKGROUND

Electronics, such as processors or memory, generate heat during operation. If left unchecked, this heat can reduce system performance and even lead to partial or complete system failure. As such, many existing technologies attempt to remove or dissipate heat through the use of heat sinks, cooling fans, etc.

While these technologies may be effective for cooling a single electronic component that is not located near other sources of heat, these technologies fall short when it comes to more complex systems and higher density systems, such as solid state drives (SSDs), dual in-line memory modules (DIMMs), and small outline-DIMMs, all of which utilize memory cells to store data as an electrical charge or voltage.

Existing cooling systems for such systems typically include multiple heat sinks and high-speed fans. These cooling systems are noisy; add significant expense to the system; increase the overall energy consumption of these systems; and decrease system efficiency. Moreover, existing cooling systems do not always alleviate localized hot-spots that form within the systems, which in turn shorten the life of the individual components within the system.

In the absence of efficient heat dissipation mechanisms, the increased heat can ultimately lead to reduced performance or failure of either individual memory cells of a memory module or the entire memory module.

In light of these and other issues, it would be desirable to provide a system and method for more effectively cooling electronic components, especially those found in systems that contain multiple heat generating components.

SUMMARY

According to some embodiments there is provided an electronic assembly that includes a first assembly rail, a top circuit board and a bottom circuit board. The first assembly rail further includes a first card guide structure and a second card guide structure, and the first and second card guide structures are arranged on a first side near two opposite edges of the first assembly rail. The top circuit board is mechanically coupled to the first card guide structure of the first assembly rail, and the bottom circuit board is mechanically coupled to the second card guide structure of the first assembly rail. The top circuit board is substantially parallel to the bottom circuit board, and separated from the bottom circuit board by a predefined distance. The first assembly rail, the top circuit board and the bottom circuit board together form a channel there between for receiving a heat dissipating airflow.

Other embodiments and advantages may be apparent to those skilled in the art in light of the descriptions and drawings in this specification.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate the more pertinent features of the present disclosure and are therefore not to be considered limiting, for the description may admit to other effective features.

FIG. 4A is a side view of another exemplary electronic assembly that includes an extended thermal channel formed by a plurality of assembly rails and a plurality of circuit boards in accordance with some embodiments.

FIG. 4B is a front or cross sectional view of an exemplary electronic assembly that includes a plurality of assembly rails coupled together at their edges in accordance with some embodiments.

Figure 1:
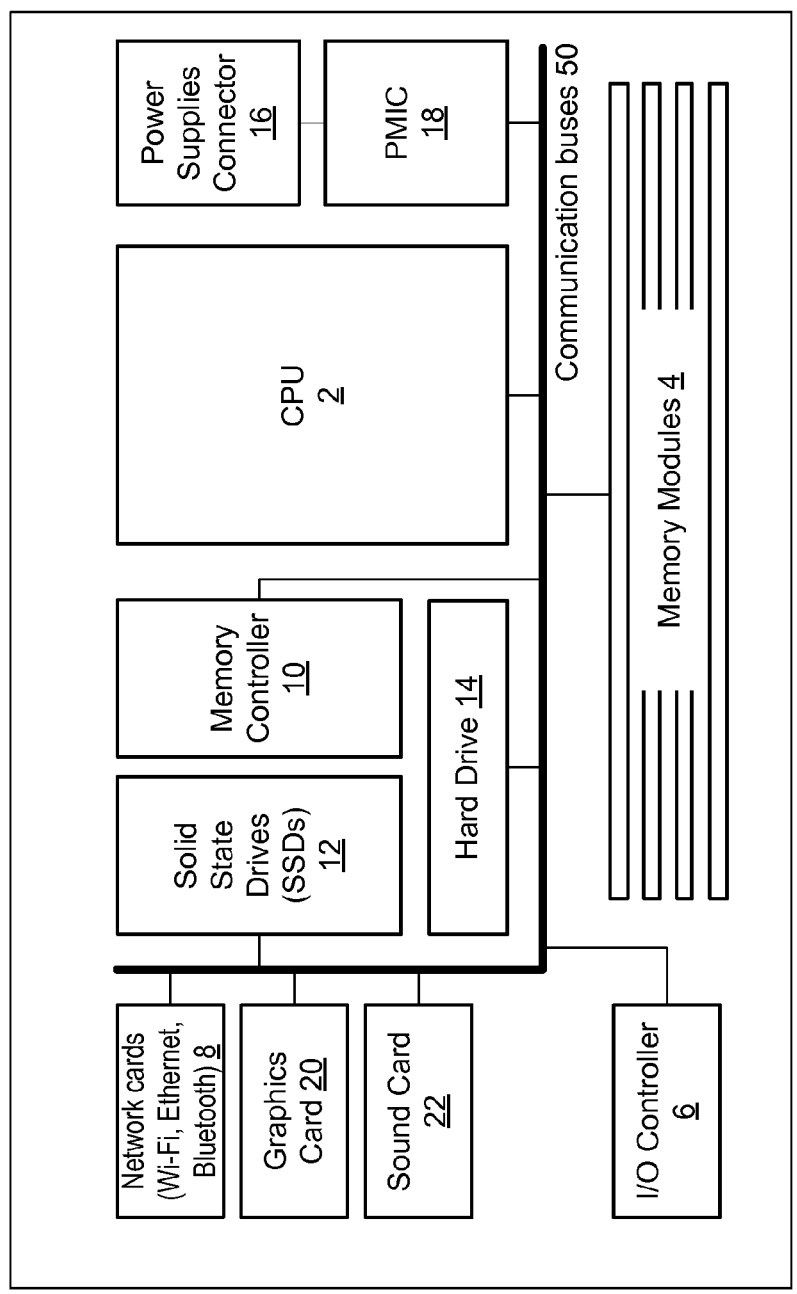
FIG. 1 is a block diagram of an exemplary system module in a typical computational device in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various embodiments described herein include systems, methods and/or devices used or integrated in electronic assemblies. In particular, the electronic assemblies and the heat dissipation method described herein manage airflow that is used to facilitate dissipation of heat generated by electronic components in the electronic systems.

While the embodiments described below primarily describe memory systems, the present inventions are not limited to such. In fact, the present invention applies equally to any electronic systems that require heat dissipation—particularly those systems that include two or more adjacent electronic circuit boards each having components that generate heat.

According to some embodiments there is provided an electronic assembly that includes a first assembly rail, a top circuit board and a bottom circuit board. The first assembly rail further includes a first card guide structure and a second card guide structure, and the first and second card guide structures are arranged on a first side near two opposite edges of the first assembly rail. The top circuit board is mechanically coupled to the first card guide structure of the first assembly rail, and the bottom circuit board is mechanically coupled to the second card guide structure of the first assembly rail. The top circuit board is substantially parallel to the bottom circuit board, and separated from the bottom circuit board by a predefined distance. The first assembly rail, the top circuit board and the bottom circuit board together form a channel there between for receiving a heat dissipating airflow.

In some embodiments, each of the first and second card guide structures includes a respective card guide slot, and a respective edge of each of the top and bottom circuit boards is configured to be inserted and locked into a corresponding card guide slot.

In some embodiments, the channel further includes an additional assembly rail facing, and substantially parallel to, the assembly rail, where the top circuit board and the bottom circuit board are mechanically coupled to the additional assembly rail between the first and second assembly rails.

In some embodiments, the electronic assembly is mechanically coupled to an external electronic system to an end of the channel via the second assembly rail.

In some embodiments, the electronic assembly is mechanically coupled to an external electronic system using one or more mounting fasteners located at an edge of the assembly rail.

In some embodiments, the channel further includes an airflow tab that is coupled to a side of the channel and includes at least one of a rigid material or a flexible cable.

In some embodiments, the top circuit board and the bottom circuit board are electronically coupled to each other via a flexible cable that itself contributes to the channel to further direct the airflow.

In some embodiments, the top circuit board and the bottom circuit board are electronically coupled to each other via one or more rigid electronic interconnects, where the one or more rigid electronic interconnects act as an airflow tab to direct the airflow.

In some embodiments, the top circuit board and the bottom circuit board are electronically coupled to each other via one or more rigid electronic interconnects, where the one or more rigid electronic interconnects are located within the channel and are configured to disturb the airflow.

In some embodiments, the electronic assembly further includes a first set of heat-sensitive electronic components mechanically coupled to one of the top or bottom circuit boards, and a second set of heat-generating electronic components mechanically coupled to the other one of the top or bottom circuit boards. In some embodiments, the electronic assembly further includes a plurality of temperature-sensitive electronic components coupled to a region of the top circuit board that is thermally isolated from other regions of the top circuit board.

In some embodiments, the assembly rail further includes a vent opening at one side of the channel.

In some embodiments, the electronic assembly further includes an additional assembly rail that is mechanically coupled to a second top circuit board and a second bottom circuit board near two opposite ends of the additional assembly rail. The second top and bottom circuit boards being substantially parallel to one another and forming at least a part of a second channel together with the second assembly rail. The additional assembly rail, the second top circuit board, and the second bottom circuit board together form an additional channel there between for receiving a heat dissipating airflow. The channel includes a first channel, and the additional channel is coupled to the first channel on its side.

In some embodiments, the top circuit board includes a first top circuit board, and the bottom circuit board includes a first bottom circuit board. The electronic assembly further includes an additional assembly rail that is mechanically coupled to a second top circuit board and a second bottom circuit board near two opposite ends of a front side of the additional assembly rail. The second top and bottom circuit boards are substantially parallel to one another and form at least a part of a second channel together with the additional assembly rail. The first top and bottom circuit boards are mechanically coupled on a back side of the additional assembly rail to form an extended channel including both the first and second channels, and in accordance with the extended channel, the airflow is directed through a vent opening of the first assembly rail, the space between the first top and bottom circuit boards, a vent opening of the second assembly rail, and space between the second top and bottom circuit boards.

In some embodiments, the assembly rail widens along a direction of the airflow to form a ducted vent opening.

According to another aspect of the invention, there is provided a heat dissipation method that includes providing a first assembly rail. The first assembly rail includes a first card guide structure, a second card guide structure and a vent opening. The first and second card guide structures are arranged on a first side of the assembly rail near two opposite edges of the first assembly rail. The heat dissipation method further includes mechanically coupling a top circuit board to the first card guide structure of the first assembly rail, and mechanically coupling a bottom circuit board to the second card guide structure of the first assembly rail. The top circuit board is substantially parallel to the bottom circuit board, and separated from the bottom circuit board by a predefined distance. Then, the first assembly rail, the top circuit board and the bottom circuit board form at least a part of a thermal channel that is configured to receive a heat dissipating airflow.

Further, according to another aspect of the invention, there is provided an electronic assembly that includes a plurality of assembly rails and a plurality of circuit board sets each further including a top circuit board and a bottom circuit board. The plurality of assembly rails that are arranged substantially in parallel. Each assembly rail includes a respective vent opening, a respective front side and a respective back side. Each side of the respective assembly rail further includes a respective first card guide structure and a respective second card guide structure that are arranged near two opposite edges of the corresponding assembly rail. For each of the plurality of circuit board set, the top circuit board and the bottom circuit board are mechanically coupled between the first card guide structures and between the second card guide structures on two respective sides of two adjacent assembly rails, respectively. The two respective sides face each other. The top circuit board is substantially parallel to the bottom circuit board, and separated from the bottom circuit board by a predefined distance. Further, the plurality of assembly rails alternate with the plurality of circuit board sets and together forms a channel having an extended length and configured to receive a heat dissipating airflow.

In some embodiments, at least one of the plurality of assembly rails is extended and widened along a direction of the airflow on at least one side of the at least one assembly rail to form a ducted vent opening.

Finally, according to another aspect of the invention, there is provided an assembly rail that is configured to form a part of a channel for receiving a heat dissipating airflow. The assembly rail includes a first card guide structure, a second card guide structure and a vent opening. The first card guide structure and the second card guide structure are arranged on a first side of the assembly rail near two opposite ends of the assembly rail and configured to receive a top circuit board and a bottom circuit board, respectively. The vent opening is located between the first card structure and the second card structure, and configured to receive the heat dissipating airflow.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the embodiments described herein.

FIG. 1 is a block diagram of an exemplary system module 100 in a typical computational device in accordance with some embodiments. The system module 100 in this computational device includes at least a central processing unit (CPU) 2, memory modules 4 for storing programs, instructions and data, an input/output (I/O) controller 6, one or more communication interfaces such as network interfaces 8, and one or more communication buses 50 for interconnecting these components. In some embodiments, the I/O controller 6 allows the CPU 2 to communicate with an I/O device (e.g., a keyboard, a mouse or a track-pad) via a universal serial bus interface. In some embodiments, the network interfaces 8 includes one or more interfaces for Wi-Fi, Ethernet and Bluetooth networks, each allowing the computational device to exchange data with an external source, e.g., a server or another computational device. In some embodiments, the communication buses 50 include circuitry (sometimes called a chipset) that interconnect and control communications among various system components included in the system module. In some embodiments, the system module 100 includes a motherboard that holds various system components (such as components 2-22).

In some embodiments, the memory modules 4 include high-speed random access memory, such as DRAM, SRAM, DDR RAM or other random access solid state memory devices. In some embodiments, the memory modules 4 include non-volatile memory, such as one or more magnetic disk storage devices, optical disk storage devices, flash memory devices, or other non-volatile solid state storage devices. In some embodiments, the memory modules 4, or alternatively the non-volatile memory device(s) within memory modules 4, include a non-transitory computer readable storage medium. In some embodiments, memory slots are reserved on the system module 100 for receiving the memory modules 4. Once inserted into the memory slots, the memory modules 4 are integrated into the system module 100.

In many embodiments, the system module 100 further includes one or more components selected from:
- a memory controller 10 that controls communication between the CPU 2 and memory components, including the memory modules 4, in the computational device;
- solid state drives (SSDs) 12 that apply integrated circuit assemblies to store data in the computational device, and in many embodiments, are based on NAND or NOR memory configurations;
- a hard drive 14 that is a conventional data storage device used for storing and retrieving digital information based on electromechanical magnetic disks;
- a power supply connector 16 that is electrically coupled to receive an external power supply;
- a power management integrated circuit (PMIC) 18 that modulates the received external power supply to other desired DC voltage levels, e.g., 5V, 3.3V or 1.8V, as required by various components or circuits within the computational device;
- a graphics card 20 that generates a feed of output images to one or more display devices according to their desirable image/video formats; and
- a sound card 22 that facilitates the input and output of audio signals to and from the computational device under control of computer programs.

Further, one of skill in the art would appreciate that other non-transitory computer readable storage media can be used, as new data storage technologies are developed for storing information in the non-transitory computer readable storage media in the memory modules 4 and in the SSDs 12. These new non-transitory computer readable storage media include, but are not limited to, those manufactured from biological materials, nanowires, carbon nanotubes and individual molecules, even though the respective data storage technologies are currently under development and yet to be commercialized.

Some of the aforementioned components generate heat during normal operation, and therefore, are integrated with separate heat sinks in order to reduce the temperatures of the corresponding components. For example, the SSDs 12 used in a blade server may have heat sinks mounted on the top of each individual dual in-line memory module (DIMM) or on an electronic assembly containing the DIMMs. Heat generated from electronic components in the DIMMs are primarily conducted to the heat sinks, and further dissipated by airflow generated by fans. However, as the data workload in these blade servers increases and the form factor of the DIMMs decreases (e.g., closely placed memory slots in the memory modules 4), it becomes more difficult for conventional heat sinks and cooling fans to conduct and dissipate the generated heat efficiently.

To address this issue, various embodiments described herein relate to an electronic assembly in which circuit boards are mechanically assembled on assembly rails to form a channel through which airflow generated by an external fan is directed. When the airflow passes along a pathway through the channel, it flows over surfaces of electronic components mounted on the circuit boards and at least partially carries-away heat generated by these components.

In some embodiments, the channel further includes one or two airflow tabs on its sides for controlling the airflow, and each airflow tab is optionally made from a rigid material, a flexible cable or a combination of both. In some embodiments, geometries (e.g., shape and dimensions) of vent openings of the assembly rails are configured to modify the dynamics of the airflow at the entrance and/or the exit of the channel. In some embodiments, locations of the electronic components on the circuit boards are arranged to physically separate heat-sensitive components from other components (such as some heat-generating components). By these means, the channel formed by the assembly rails and the circuit boards may further improve the heat dissipation efficiency of the electronic assembly, in addition to the aforementioned conventional solutions using heat sinks and high-speed fans.

Figure 2A:
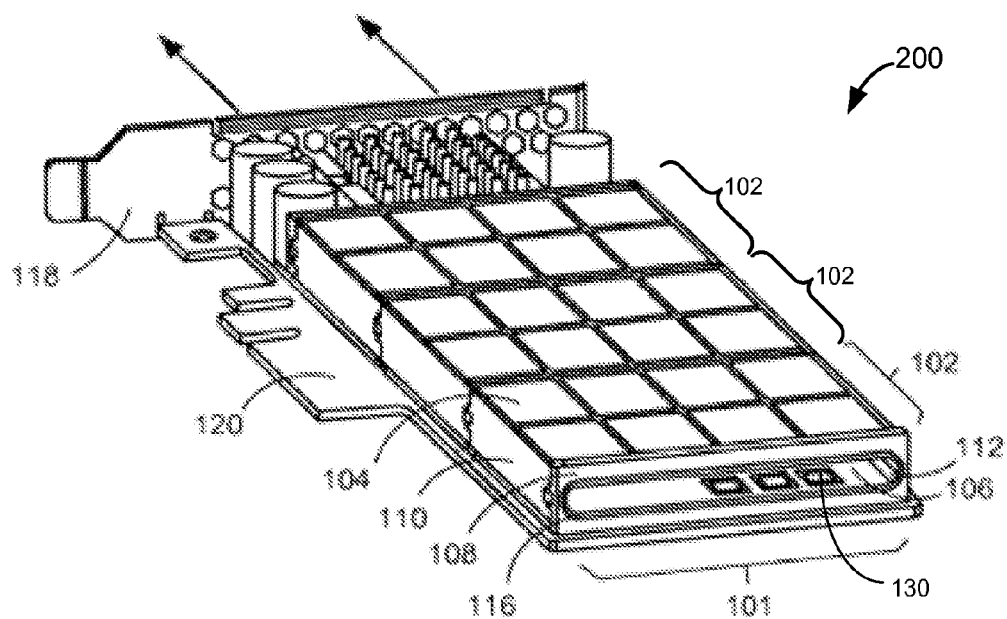
FIG. 2A is an isometric view of an exemplary electronic assembly that includes an extended thermal channel formed by circuit boards and assembly rails and in accordance with some embodiments.

FIG. 2A is an isometric view of an exemplary electronic assembly 200 that includes a channel 101 formed by the combination of circuit boards and one or more assembly rails. In some implementations, the channel 101 is formed by mechanically coupling one or more duct units 102 to one another. Each duct unit 102 includes at least a top circuit board 104, a bottom circuit board 106 and an assembly rail 108. Each duct unit 102 optionally includes an airflow tab 110 to substantially close each side of the duct unit 102, i.e., enclose the duct on all four sides. When coupled to one another, the duct unit 102 provides an extended length channel 101. As such, the channel 101 includes an interior airflow pathway bounded by the top circuit board 104, the bottom circuit board 106, and the optional airflow tabs 110 of each duct unit 102. When airflow passes through the interior airflow pathway of the channel 101, it at least partially carries away the heat generated in the electronic assembly 200.

In some embodiments, at least one of the top circuit board 104 and bottom circuit board 106 include one or more solid state drives (SSDs). In some embodiments, at least one of the top circuit board 104 and the bottom circuit board 106 include one or more three-dimensional (3D) memory devices.

In some embodiments, the assembly rail 108 or 108A (e.g., a first assembly rail) acts as a structural frame of each duct unit 102. The top circuit board 104 and the bottom circuit board 106 are mechanically coupled on a first side (e.g., a back side) near two opposite ends of the assembly rail 112. The airflow tab 110 is optionally coupled to the assembly rail 108, the top circuit board 104, and/or the bottom circuit board 106. In some implementations, when the electronic assembly 200 only includes one duct unit 102, the duct unit 102 optionally includes an additional assembly rail 108B (e.g., a second assembly rail) that is positioned substantially parallel with the first assembly rail 108. The top and bottom circuit boards 104 and 106 are similarly coupled to the first and second assembly rails 108A and 108B but at two opposite edges of the respective circuit board. In this embodiment, the airflow enters the channel 101 from one assembly rail 108, passes through the space between the top and bottom circuit boards 104 and 106, and exits from the other assembly rail 108.

In some embodiments, the electronic assembly 100 includes more than one duct unit 102 (e.g., three duct units—as shown in FIG. 1) that are coupled to each other. Here, the channel 101 formed by these duct units 102 are aligned with each other to form a channel 101 having an extended length. The assembly rail 108 is optionally coupled at an entrance of the channel 101, at the interface of two duct units 102, or at the exit of the channel 101. When the assembly rail 108 (e.g., rail 108B) is coupled at the interface of two duct units 102, it is mechanically coupled not only to the circuit boards of the duct unit 102 which it belongs to, but also to the circuit boards of an adjacent duct unit 102. Thus, the top circuit board 104 and the bottom circuit board of each duct unit 102 are mechanically coupled between two assembly rails 108 of the electronic assembly 200.

In some embodiments, assembly rail 108 forms a vent opening 116 through which the airflow passes into the channel 101. Optionally, the shape of the vent opening 116 is selected from a rectangle, a square, a circle, an oval, a triangle, a diamond and the like. Optionally, corners of the vent opening 116 are rounded. Optionally, the vent opening includes one or more openings configured according to a pattern (e.g., a grill pattern).

In some embodiments, each of the top circuit board 104 and the bottom circuit board 106 is a printed circuit board. Examples of such a circuit board include, but are not limited to, a flash memory board of a solid-state drive (SSD) 112, a memory board of memory modules 104, a graphics board of the graphics card 120, a controller board, a co-processor board, a communication interface, a blank board, or a combination thereof.

Each circuit board 104 or 106 further includes a plurality of electronic components 130 that are mechanically and electrically coupled to a substrate of the respective circuit board 104 or 106. For example, the electronic components 130 are memory components that are mounted on a memory module. The electronic components 130 are optionally coupled on either side or both sides of the substrate of the respective board 104 or 106. When the airflow passes through the interior airflow pathway of the channel 101, heat generated by the plurality of electronic components 130 is at least partially carried away by the airflow. In some embodiments, some electronic components 130 generate substantially more heat or are more sensitive to temperature increases than other components 130, and such electronic components 130 are preferably mounted on the interior airflow pathway of the channel, e.g., a back side of the top circuit board 104 or a top side of the bottom circuit board 106.

An airflow tab 110 of the channel 101 (or the duct unit 102) is optionally made from a rigid tab, a flexible cable or a combination of both. In some embodiments, the rigid tab is mechanically coupled to a third edge of the assembly rail 108, and the third edge is distinct from the two opposite edges of the assembly rail 108 to which the circuit boards 104 and 106 are coupled. An airflow tab 110 made of the rigid tab avoids the airflow from leaking through the corresponding side of the channel 101. In some embodiments, the top circuit board 104 and the bottom circuit board 106 are electronically coupled to each other via a rigid tab including one or more rigid electronic interconnects (sometimes called electronic connectors). When such rigid electronic interconnects are located substantially close to a respective edge area of the circuit boards, they perform the same function as the airflow tab 110 to constrain the airflow substantially within the interior airflow pathway of the channel 101. In some embodiments, the top circuit board 104 and the bottom circuit board 106 are electronically coupled to each other via a flexible cable, and the flexible cable forms another part of the channel to further direct the airflow within the interior airflow pathway. In some embodiments, rigid interconnects and a flexible cable together couple the top and bottom circuit boards 104 and 106. For instance, two rigid interconnects are coupled to the top circuit board 104 and the bottom circuit board 106, respectively, and these boards are further coupled together by a flexible cable. Here, the combination of the rigid interconnects and the flexible cable also performs the function of the airflow tab 110 to direct the airflow through the interior airflow pathway of the channel 101.

In some embodiments, the channel 101 is further coupled to an external electronic system (e.g., a backplate 118) at one of its two channel ends. The backplate 118 is configured to include a vent opening at a corresponding position according to the position of the vent opening 116 of the assembly rail 108. The shape and configuration of the vent opening of the backplate 118 are optionally configured according to those of the vent opening 116. In some embodiments, the airflow that passes through the channel 101 enters from the vent opening of the backplate 118 and flows through the channel 101, while in some embodiments, the airflow flows through the channel 101, and exits from the vent opening of the backplate 118.

In some embodiments, the electronic assembly 100 is mechanically coupled on top of an external component or system 120, such as a PCI interface card, an ExpressCard housing, a PC card housing, a motherboard of a server, a bus slot of an embedded controller system, or a combination thereof. In one specific example, the electronic assembly 100 constitutes a daughterboard structure, and is assembled directly to a motherboard.

In some embodiments (not shown in FIG. 2A), the electronic assembly 200 is coupled to one or more heat sinks. The heat sinks are optionally coupled to the electronic components 130 or to the circuit boards 104 and 106 to absorb and dissipate heat generated by the electronic components 130. In some specific embodiments, a heat sink is coupled between a corresponding assembly rail and an edge of a circuit board (e.g., a top circuit board 104 or a bottom circuit board 106) as described in U.S. Provisional Application Ser. No. 61/945,674, filed on Feb. 27, 2014, titled "Heat Dissipation for Substrate Assemblies," which is hereby incorporated by reference in its entirety. The heat sink includes a card guide tab and an attachment structure to mechanically couple to the assembly rail and the circuit board edge, respectively. The heat sink optionally includes heat dissipaters to at least partially dissipate the heat that is generated by the electronic components 130 and absorbed by the heat sink.

Figure 2B:
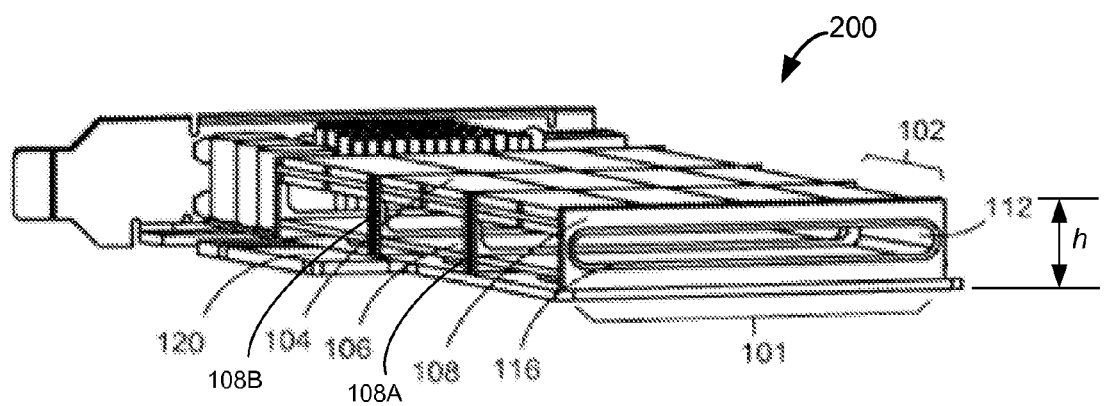
FIG. 2B is another isometric view of the exemplary electronic assembly shown in FIG. 2A in accordance with some embodiments.

FIG. 2B is another isometric view of the exemplary electronic assembly 200 shown in FIG. 2A in accordance with some embodiments. The electronic assembly 200 includes a plurality of duct units 102 configured to form the channel 101. The duct units 102 are coupled together to form an extended length channel. In particular, the airflow tab 110 of each duct unit 102 is removed to better illustrate the electronic assembly 200.

After the duct units 102 are assembled into the electronic assembly 200, the electronic assembly 200 includes a plurality of assembly rails and a plurality of circuit board sets each including a top circuit board 104 and a bottom circuit board 106. The plurality of assembly rails 108 alternate with the plurality of circuit board sets and together form the channel 101 that has the extended length. This channel 101 is configured to direct airflow through a respective vent opening 116 of each assembly rail 108 and into the channel between the top and bottom circuit boards 104 and 106 of each circuit board set successively.

Each assembly rail 108 includes a respective vent opening 116, a respective first side (e.g., a front side) and a respective second side (e.g., a backside). Each side of the respective assembly rail 108 further includes a first card guide structure and a second card guide structure that are arranged near two opposite edges of the respective side of the corresponding assembly rail 108, respectively.

Each circuit board set is coupled between two adjacent assembly rails 108. The top circuit board and the bottom circuit board re mechanically coupled between the first card guide structures and between the second card guide structures on two respective sides of two adjacent assembly rails, respectively. The two respective sides of the two adjacent assembly rails face each other. As such, the top circuit board 104 is substantially parallel to the bottom circuit board 106, and separated from the bottom circuit board 106 by a predefined distance. In a specific example, the predefined distance is determined in accordance with a rail height h of the plurality of assembly rails (including the assembly rails 108A and 108B).

In the specific embodiments shown in FIGS. 2A and 2B, the channel 101 includes three sets of circuit boards. One skilled in the art knows that the channel 101 may optionally have only one circuit board set that further includes a top circuit board 104 and a bottom circuit board 106 and that the circuit board set is coupled between two adjacent assembly rails 108.

Figures 3A, 3B:
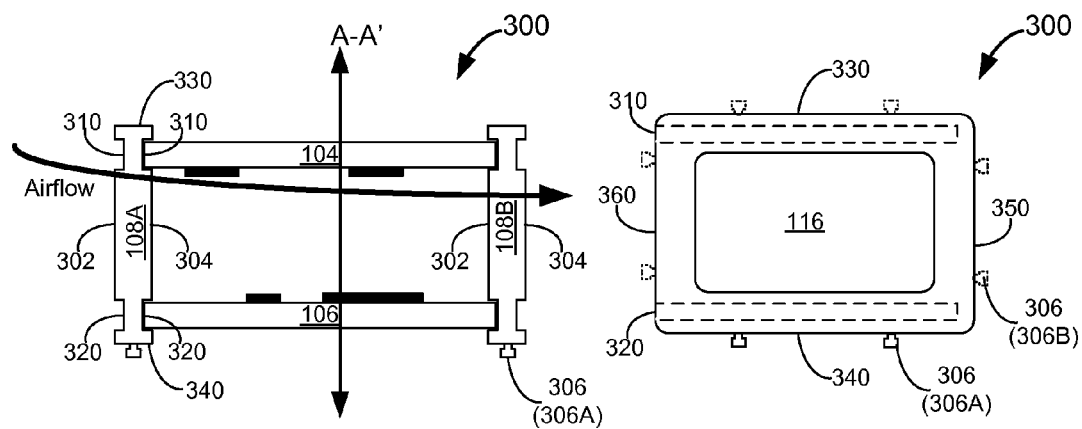
FIG. 3A is a side view of an exemplary electronic assembly that includes two circuit boards coupled between two assembly rails in accordance with some embodiments.
FIG. 3B is a front view of the exemplary electronic assembly configured to direct airflow through a vent opening of an assembly rail in accordance with some embodiments.

FIG. 3A is a side view of an exemplary electronic assembly 300 that includes two circuit boards coupled between two assembly rails 108 in accordance with some embodiments, and FIG. 3B is a front view of the exemplary electronic assembly 300 configured to direct airflow through a vent opening 116 of an assembly rail 108 in accordance with some embodiments. In the electronic assembly 300, a top circuit board 104 and a bottom circuit board 106 are mechanically coupled between the two assembly rails 108 (e.g., a first assembly rail 108A and a second assembly rail 108B). In some embodiments, the first assembly rail 108A and the circuit boards 104 and 106 form part of a duct unit 102, and the duct unit 102 and the second assembly rail 108 are assembled together to form the electronic assembly 300.

Each assembly rail 108 includes a front side 302 and a back side 304, and each side of the assembly rail 108 further includes a first card guide structure 310 and a second card guide structure 320. On each side of the assembly rail 108, the first and second card guide structures 310 and 320 are arranged near two opposite edges (or ends) 330 and 340 of each assembly rail 108. The top circuit board 104 is mechanically coupled and locked to the two first card guide structures 310 on the back side 304 of the first assembly rail 108A and the front side of the second assembly rail 108B, respectively. The bottom circuit board 106 is mechanically coupled and locked to the two second card guide structures 320 on the back side 304 of the first assembly rail 108A and the front side of the second assembly rail 108B, respectively. In some implementations, the first card guide structure 310 and the first card guide structure 320 on each side of the assembly rail 108 are configured to be substantially parallel to each other, such that the top and bottom circuit boards 104 and 106 are also substantially parallel to each other when they are mechanically coupled to the first and second card guide structures 310 and 320, respectively.

In some embodiments, each card guide structure 310 or 320 includes a respective board guide slot, and a top or bottom circuit board 104,106 is inserted and optionally locked into the corresponding board guide slot.

In some embodiments, the assembly rail 108 further includes one or more mounting fasteners 306 on any one of its edges (such as the edges 330, 340, 350 and 360), such that the assembly rail 108 may be mechanically coupled to another component or another assembly rail 108 via the mounting fasteners 306. In some embodiments, the mounting fasteners 306 (e.g., the fasteners 306A) are located on a bottom edge 340 of the assembly rail 108 (i.e., externally on the bottom of the channel 101), and used to mount the electronic assembly 300 on top of an external component or system 120 (e.g., a motherboard). In some embodiments, the mounting fasteners 306 (e.g., the fasteners 306B) are located on the side edge 350 or 360 of the assembly rail 108 (i.e., externally on a side of the channel 101). Optionally, the mounting fasteners 306B on the side edges 350 and 360 are configured to couple an airflow tab 110 to the assembly rail(s) 108. Optionally, the mounting fasteners 306B on the side edges 350 and 360 are configured to couple two electronic assemblies 300 side-by-side or couple the electronic assembly 300 to an external component or system (e.g., a motherboard).

Naturally occurring airflow or airflow created by a fan enters the channel 101 via the vent opening 116 of the assembly rail 108A, passes through the space between the top circuit board 104 and the bottom circuit board 106, and exits the channel 101 from the vent opening 116 of the assembly rail 108B. When the assembly rail 108B is further coupled to a backplate 118, the airflow further passes through the corresponding vent opening on the backplate 118 after exiting the channel 101.

In some embodiments, the electronic components 130 of the top circuit board 104 or the bottom circuit board 106 are optionally coupled to one side or on both sides of a respective circuit board. However, in some embodiments, the electronic components 130 are preferably placed in the channel or interior airflow pathway (including the corresponding side of the circuit board that is passed by the airflow) to benefit from the heat dissipation effect provided by the airflow. For example, the electronic components 130 are placed on a back side of the top circuit board 104 or a top side of the bottom circuit board 106. In some embodiments where an electronic component 130 generates substantially more heat than other electronic components 130 and/or when an electronic component 130 is more sensitive to a temperature increase than other electronic components 130, the electronic component 130 is placed on the interior airflow pathway. In either embodiment, placing the heat-generating or heat-sensitive electronic components 130 on the interior airflow pathway of the channel 101 allows the generated or absorbed heat to be dissipated more efficiently by the airflow and reduces local temperature increases that could degrade the performances of the corresponding electronic components 130.

In some embodiments, in addition to placing the electronic components 130 on the interior airflow pathway of the channel 101, the heat-sensitive electronic components 130 are physically separated from other electronic components, and in particular, separated from the heat-generating electronic components to avoid temperature increases. For example, the heat-sensitive and heat-generating electronic components are located on the top circuit board 104 and the bottom circuit board 106, respectively. In some embodiments, the heat-sensitive electronic components are disposed at a region of the top circuit board that is thermally isolated from other regions of the top circuit board, and thereby substantially insulated from heat generated by other electronic components on the top and bottom circuit boards.

In some embodiments, the heat-sensitive and heat-generating electronic components are located at two distinct regions of one circuit board (the top circuit board 104 or the bottom circuit board 106). In some embodiments, the region that includes the heat-sensitive electronic components is positioned upstream in the airflow from the region that includes the other electronic components (including the heat-generating electronic components).

In some embodiments related to memory modules, memory cells are sensitive to temperature increases but they do not generate a large amount of heat. The memory controllers may not be sensitive to temperature increases but themselves generate a relatively larger amount of heat. The heat-sensitive memory cells and the heat-generating memory controllers are positioned on the interior airflow pathway of the channel 101, and they are separately mounted on two circuit boards or at two distinct regions of one circuit board as discussed above.

Figure 3C:
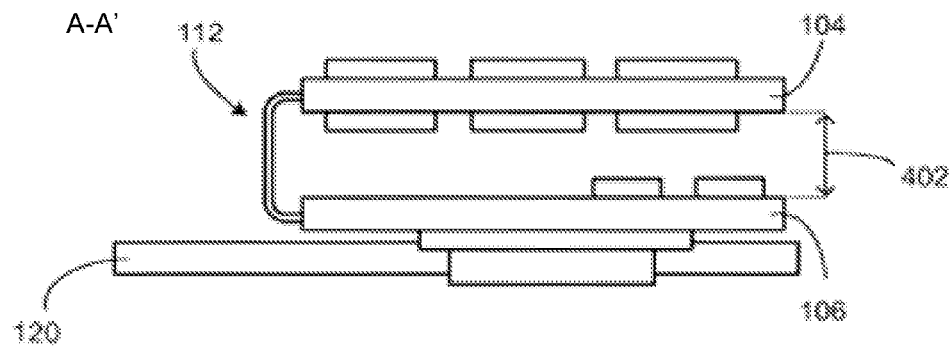
FIG. 3C is a cross sectional view of an exemplary electronic assembly that uses a flexible cable to electrically couple two circuit boards in accordance with some embodiments.

FIG. 3C is a cross sectional view of an exemplary electronic assembly 300 that uses a flexible cable 112 to electrically couple two circuit boards 104 and 106 in accordance with some embodiments. The cross sectional view is optionally associated with a part of the cross section A-A' of the electronic assembly 300 shown in FIG. 3A. In some embodiments, the electronic assembly 300 is further coupled to an external component or system 120 via mounting fasteners 340 on the assembly rails 108.

The flexible cable 112 includes a flexible substrate and interconnect that are embedded in the flexible substrate. The interconnect electrically couples the top circuit board 104 and a bottom circuit board 106, and carries electrical signals between these two circuit boards. The flexible substrate of the flexible cable 112 is made of flexible materials, such as polymeric materials. Examples of the flexible cable 112 include, but are not limited to, a flexible board, flexible wire array, flexible PCB, flexible flat cable, ribbon cable, and a combination thereof.

In some embodiments, the flexible cable 112 becomes a part of an airflow tab on one side of the channel 101 to at least partially direct the airflow that passes the channel 101. In some implementations, the flexible cable 112 faces another airflow tab 110 that lies close to another opposite edge area of the channel 101. In some other embodiments, the flexible cable 112 is provided in addition to an existing airflow tab 101, and faces the other airflow tab 110 that lies close to the other opposite edge area of the channel 101.

Figure 3D:
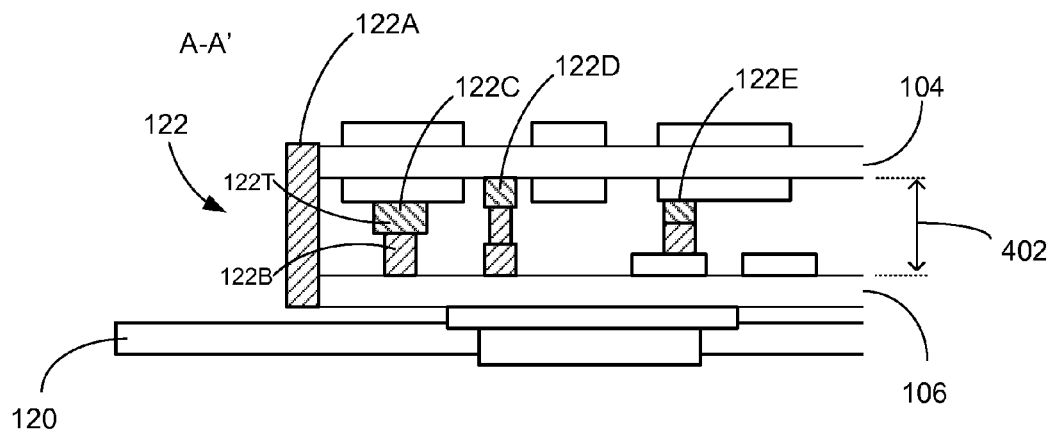
FIG. 3D is a cross sectional view of an exemplary electronic system that includes a rigid tab and/or a rigid interconnect in accordance with some embodiments.

In some implementations, a rigid tab mechanically couples the top circuit board 104 to the bottom circuit board 106 of the duct unit 102 of the electronic assembly 101. FIG. 3D is a cross sectional view of an exemplary electronic system 300 that includes a rigid tab 122 in accordance with some embodiments. The cross sectional view is optionally associated with a part of the cross section A-A' of the electronic assembly 300 shown in FIG. 3A. Here, the rigid tab 122 mechanically couples two circuit boards 104 and 106 together, and broadly includes a rigid tab 122A and rigid interconnects 122C-122E. As used herein, a rigid interconnect is also called as a rigid connector.

In some embodiments, the rigid tab 122 is positioned substantially close to the corresponding edges of the two circuit boards 104 and 106, and acts as an airflow tab 110 of the channel 101. The rigid tab 122 is optionally coupled on an edge of the assembly rail 101 using the fasteners 306B, or is coupled to the edges of the two circuit boards 104 and 106.

Optionally, the rigid tab 122 (e.g., the rigid tab 122A) does not include interconnects, and only mechanically couples the top circuit board 104 and the bottom circuit board 106. Optionally, the rigid tab 122 (e.g., the rigid tab 122A and the rigid interconnects 122C-122E) further includes interconnects that electrically and mechanically couples the top circuit board 104 and the bottom circuit board 106.

In some implementations, one or more of the rigid interconnects 122C-122E are positioned internally within the channel 101. In some implementations, an internally positioned interconnect 122 is configured to disturb but not block airflow in the thermal channel. As a specific, non-limiting example, when the internally positioned interconnect contains a row of conductive pins, it is preferably oriented to substantially align with the airflow tabs and along the airflow direction.

Optionally, a respective rigid interconnect, such as the rigid interconnect 122A, includes a single interconnect part that includes two electrical terminals, one electrically coupled to the top circuit board 104 and the other electrically couples to the bottom circuit board 106. Optionally, a respective rigid interconnect, such as the rigid interconnect 122C, includes two complimentary interconnect parts 122T and 122B, where the interconnect part 122T is configured to connect to the top circuit board 104, and the interconnect part 122B is configured to connect to the bottom circuit board 106. In addition, the interconnect parts 122T and 122B are further pluggable one into the other to form an electrical connection between the top and bottom circuit boards. Optionally, a respective rigid interconnect, such as the rigid interconnect 122D, includes a set of interconnect parts that has more than two interconnect parts. Two of these interconnect parts are configured to be coupled to the top circuit board 104 and the bottom circuit board 106, respectively, and furthermore the set of interconnect parts are configured to be assembled into a rigid interconnect that couples the top circuit board 104 to the bottom circuit board 106.

In some embodiments, the interconnect, whether implemented as the flexible interconnect 112 (shown in FIG. 3C) or the rigid interconnect 122 (shown in FIG. 3D), includes a plurality of parallel wires, conductive channels, or signal paths, between the top circuit board 104 and the bottom circuit board 106. In some embodiments, both ends of the interconnect 112 comprise terminals. For example, in some embodiments, each terminal of rigid interconnect 122 includes a plurality of conductive pins that are assembled on an insulating housing of the rigid interconnect 122. Each respective terminal of rigid interconnect 122 is optionally configured to be connected to a corresponding circuit board via surface mounting technology or through-hole technology. In some embodiments, conductive pins of the respective terminals are configured to be soldered to conductive pads or via holes that are coated with conductive materials on the corresponding circuit board, thereby forming mechanical and electrical connections with the circuit board.

In some embodiments, the height of the rigid interconnect 122 is commensurate with a separation distance 402, which is the distance between the top circuit board 104 and the bottom circuit board 106. Furthermore, in some embodiments, the rail height h of the assembly rail 108 is also commensurate with the separation distance 402 and/or the height of the rigid interconnect 122.

Optionally, rigid interconnect 122 (e.g., the interconnect 122A) is attached to respective sides of the top circuit board 104 and the bottom circuit board 106, and optionally faces another airflow tab attached to opposite sides of the boards. Optionally, the rigid interconnect 122 (e.g., the interconnect 122C, 122D or 122E) is attached to respective inner regions of the top circuit board 104 and the bottom circuit board 106. In some implementations, two terminals of the rigid interconnect 122 (e.g., the interconnect 122D) are directly mounted on the top circuit board 104 and the bottom circuit board 106. In some implementations, one terminal of the rigid interconnect 122 (e.g., the interconnect 122B) is attached indirectly to a circuit board via an electronic part that is already mounted on the circuit board. In some implementations, both terminals of the rigid interconnect 122 (e.g., the interconnect 122E) are attached indirectly to the top circuit board 104 and the bottom circuit board 106 via a respective electronic part that is already mounted on the corresponding circuit board. In some implementations, the rigid interconnect 122 is instead a semi-rigid interconnect.

It is noted that an interconnect that electrically couples the top circuit board 104 and the bottom circuit board 106 may also include both a flexible interconnect part and a rigid interconnect part. As a specific example, a rigid interconnect part is coupled to the top circuit board 104 at one end and to a flexible interconnect part at the other end, and the flexible interconnect part further connects to the bottom circuit board 106 or to another rigid interconnect that connects to the bottom circuit board 106.

In some implementations, as shown in FIG. 3D, a respective rigid interconnect 122 (e.g., the interconnect 122E) is attached to respective inner regions of the top circuit board 104 and the bottom circuit board 106 and carries electrical signals between the top circuit board 104 and the bottom circuit board 106. In some of these implementations, the electronic assembly (or a duct unit of the electronic assembly) also includes one or two airflow tabs 110, positioned on one or both respective sides of the channel 101, to constraint airflow between the top and bottom circuit boards 104 and 106.

In some embodiments, a respective rigid interconnect 122 (e.g., the interconnect 122A) is positioned at or substantially close to respective edges of the top circuit board 104 and the bottom circuit board 106. In one example, the rigid interconnect extends substantially the entire length of the duct unit 102, or substantially the length of the entire the top circuit board 104 and/or the bottom circuit board 106. In some embodiments, a respective rigid interconnect 122 is used in place of a corresponding airflow tab 110 to control or direct airflow between the top circuit board 104 and the bottom circuit board 106. In some embodiments, however, a respective rigid interconnect 122 has a length substantially shorter than the length of the duct unit 102, or substantially shorter than the length of the top circuit board 104 and/or the bottom circuit board 106.

FIG. 4A is a side view of another exemplary electronic assembly 200 that includes an extended channel 101 formed by a plurality of assembly rails 108 and a plurality of circuit boards 104 and 106 in accordance with some embodiments. In some implementations, the electronic assembly 200 is formed by coupling a sequence of duct units 102 to each other and optionally attaching an assembly rail 108' to an end duct unit 108 in the sequence.

Each assembly rail 108 alternates with a circuit board set including a top circuit board 104 and a bottom circuit board 106. The assembly rails 108 are positioned substantially in parallel and coaligned with each other. After being assembled on the assembly rails 108, the top circuit boards 104 and the bottom circuit boards 106 in the circuit board sets are also parallel to each other. As such, each circuit board set is mechanically coupled between two substantially parallel assembly rails 108. Specifically, each assembly rail 108 includes a respective first side (e.g., a front side) and a respective second side (e.g., a back side). Each side of the respective assembly rail 108 further includes a first card guide structure 310 and a second guide structure 320 that are arranged on the respective side near two opposite edges of the corresponding assembly rail 108, respectively.

In some embodiments, the top circuit board 104 and the bottom circuit board 106 of each circuit board set are coupled on the card guide structures 310 and 320 of two adjacent assembly rails 108 (e.g., a first assembly rail and a second assembly rail), respectively. In particular, the top circuit board 104 is mechanically coupled between a first card guide structure 310A on a back side of a first assembly rail 108 and another first card guide structure 310B on a front side of a second assembly rail 108, and the bottom circuit board 106 is mechanically coupled between a second card guide structure 320A on the back side of the first assembly rail 108A and another second card guide structure 320B on the front side of the second assembly rail 108B. As such, the top and bottom circuit boards 104 and 106 are substantially parallel to and separated from each other. In one example, and the top and bottom circuit boards 104 and 106 have a separation that is defined in accordance with a rail height h of the plurality of assembly rails.

Each assembly rail 108 further includes a vent opening 116 between the first and second card guide structures. The vent openings 116 of the plurality of assembly rails 108 are aligned to each other, and further aligned to the respective space between the top and bottom circuit boards of each circuit board set, thereby forming an interior airflow pathway for the channel 101. In accordance with such an interior airflow pathway, airflow is directed through the vent opening of each assembly rail and space between the top and bottom circuit boards of each circuit board set successively.

FIG. 4B is a front view of an exemplary electronic assembly 200 that includes a plurality of assembly rails 108 coupled together at their edges (e.g., one of the edges 330-360) in accordance with some embodiments. As explained above, each assembly rail 108 optionally includes mounting fasteners 306 on its edges 330-360. In some embodiments, the mounting fasteners 306 on two opposite edges (such as the opposite edges 330 and 340, and the opposite edges 350 and 360) match with each other, such that every two assembly rails 108 may be coupled to each other via the mounting fasteners 306. For example, as shown in FIG. 4B, the mounting fasteners 306B have allowed every two assembly rails 108A and 108B, 108B and 108C, 108D and 108E, and 108E and 108F to mechanically couple to each other on their corresponding opposite edges 350 and 360. The mounting fasteners 306 have also allowed every two assembly rails 108A and 108D, 108B and 108E, and 108C and 108F to mechanically couple to each other on their corresponding opposite edges 330 and 340.

Each assembly rail 108 is associated with a respective channel 101 that includes one or more circuit board sets, and is optionally located at an end or an intermediate location of the respective channel 101. In some embodiments, corresponding duct units 102 of two neighboring thermal channels 101 do not include airflow tabs at their adjacent sides, and the airflow in one of these two neighboring thermal channels 101 freely enters the corresponding airflow pathway of the other channel 101. In some embodiments, corresponding duct units 102 of two neighboring thermal channels 101 do not include a bottom circuit board 106 and a top circuit board 104, respectively, and the airflow in one of these two neighboring thermal channels 101 may also freely enter the corresponding airflow pathway of the other channel 101.

In some embodiments, when multiple thermal channels 101 are coupled to one another as shown in FIG. 4B, the airflow does not pass over surfaces of electronic components 118 that are coupled externally to each channel 101, e.g., on a top side of the top circuit board 104 or a back side of the bottom circuit board 106. Therefore, these externally coupled electronic components 118 does not dissipate heat as efficiently as the electronic components 118 located on the respective interior airflow pathway (i.e., internally in the channel 101). Therefore, in some embodiments, the electronic components 118 that generate less heat and/or are less sensitive to temperature increases are coupled externally to the respective channel 101.

Figure 5A:
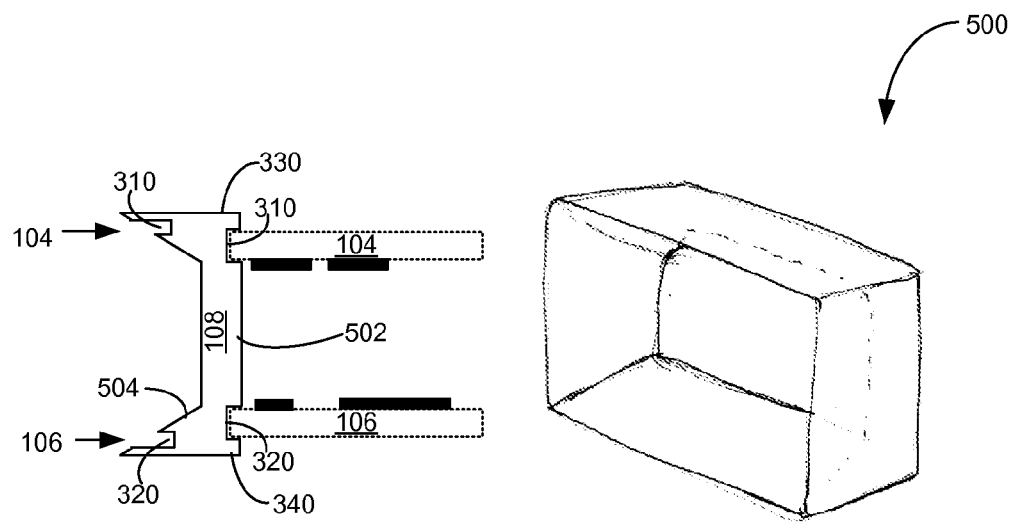
FIGS. 5A and 5B illustrate a side view and an isometric view of two exemplary assembly rails and each including a respective ducted vent opening and a respective duct portion extended and widened along an airflow direction in accordance with some embodiments.
Figure 5B:
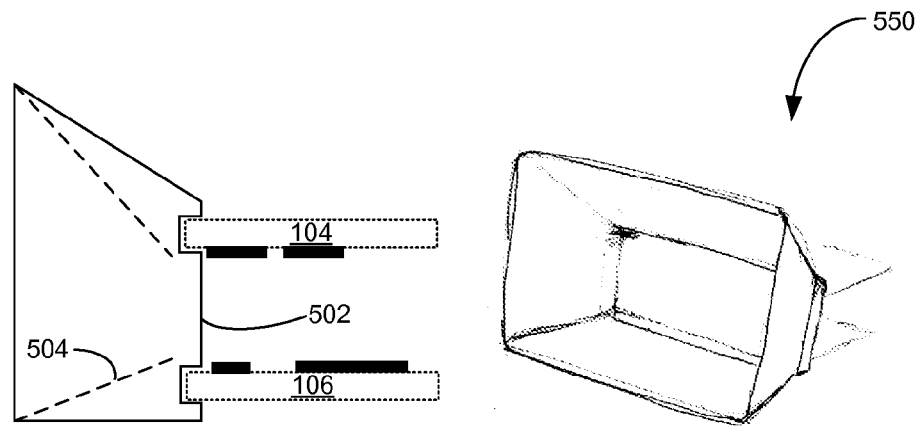

FIGS. 5A and 5B illustrate a side view and an isometric view of two exemplary assembly rails 500 and 550 each including a respective ducted vent opening 502 extended and widened along an airflow direction in accordance with some embodiments. The respective ducted vent opening 502 further includes a duct portion 504. Although the duct portions 504 shown in FIGS. 5A and 5B are included and configured to extend and widen on one side of the respective assembly rail, they are optionally included, and configured to extend and widen at both sides of the assembly rail. The duct portion 504 optionally guides the airflow to enter or exit the ducted vent opening 502, when the ducted vent opening 502 is located on an airflow incoming or outgoing side of the assembly rail 500 or 550, respectively.

As shown in FIG. 5A, in some embodiments, the duct portion 504 widens from the ducted vent opening 502 to the edges of the assembly rail 500. Optionally, the assembly rail 500 replaces one or both end assembly rails 108 that are coupled at the ends of the channel 101, while being preferably used on an airflow incoming end of the channel 101. Optionally, the assembly rail 500 is used at an intermediate assembly rail 108 of the channel 101 to control the airflow that passes through the interior airflow pathway of the channel 101. In some embodiments, the assembly rail 500 includes card guide structures 310 and 320 on a respective duct portion 504 of the duct vent opening 502. The card guide structures 310 and 320 are still located near the two opposite edges 330 and 340 of the assembly rail 400, such that a top circuit board 104 and a bottom circuit board 106 may be assembled to the assembly rail 500 if needed.

As shown in FIG. 5B, in some embodiments, the duct portion 504 of the ducted vent opening 502 widens beyond the assembly rail edges 330-360 around the vent opening 502. Geometric configurations and dimensions of the duct portion 504 are configured according to specific airflow dynamics requirements. In some embodiments, the duct portion 504 of the ducted vent opening 502 in the assembly rail 550 is substantially wider than the duct portion 504 of the ducted vent opening 502 in the assembly rail 500. The assembly rail 550 is preferably used on an airflow incoming end of the channel 101, although it may also be used on an airflow outgoing end of the channel 101, or at an intermediate assembly rail 108 of the channel 101. In some embodiments, the assembly rail 550 includes card guide structures 310 and 320 on a respective duct portion 504, such that a top circuit board 104 and a bottom circuit board 106 may be assembled to the assembly rail 500.

One skilled in the art knows that the assembly rails 500 and 550 having the ducted venting openings 502 may also act as structural frames to assemble the electronic assembly 200 shown in FIGS. 2A-2B, 3A-3D and 4A-4B. For brevity, the analogous details are not repeated here.

Figure 6:
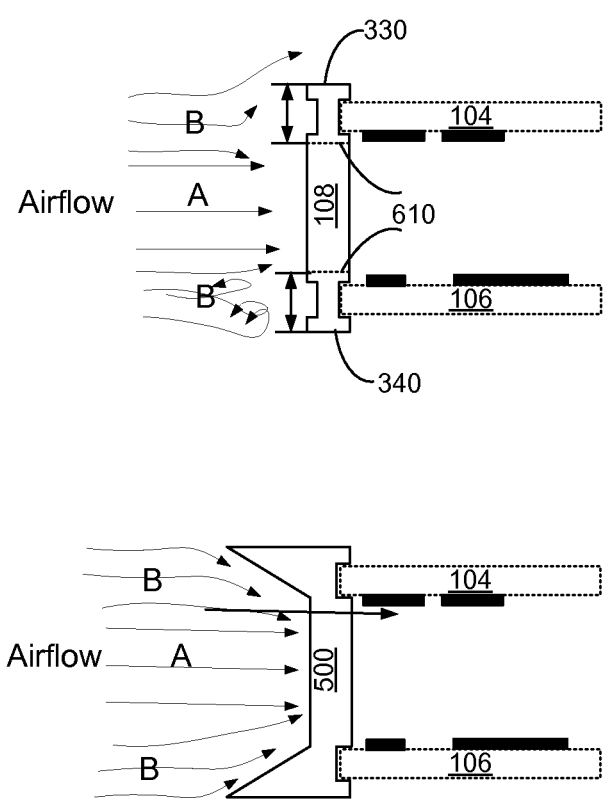
FIG. 6 is a comparison of the airflow dynamics around a regular vent opening and a ducted vent opening of two exemplary assembly rails in accordance with some embodiments, respectively.

FIG. 6 is a comparison 600 of the airflow dynamics around a regular vent opening 116 and a ducted vent opening 502 of two exemplary assembly rails 108 and 500 in accordance with some embodiments, respectively. Here, the assembly rails 108 and 500 are used at an airflow inlet end of the channel 101. A part (e.g., part A) of incoming airflow easily enters the regular vent opening of the assembly rail 108, and however, another part (e.g., part B) of the inlet airflow hits an edge area between an edge 330 or 340 of the assembly rail 108 and an edge 610 of the regular vent opening 116. The part B of the incoming airflow causes turbulence around the edge area, and is ultimately blocked from entering or redirected into the vent opening 116. Such a blocked or redirected part B of the incoming airflow reduces the amount of the air that enters the channel 101, and thereby compromises the flow rate of the airflow in the channel 101.

In contrast, as shown in FIG. 6B, the part B of the incoming airflow are guided by the duct portion 504 and enters the ducted vent opening 116 when the assembly rail 500 is applied at the airflow incoming end of the channel 101. Such a directed airflow improves the amount of the air that enters the channel 101 and the flow rate of the airflow in the channel 101, and the overall heat dissipation efficiency of the electronic assembly 200 are thereby enhanced.

Figure 7:
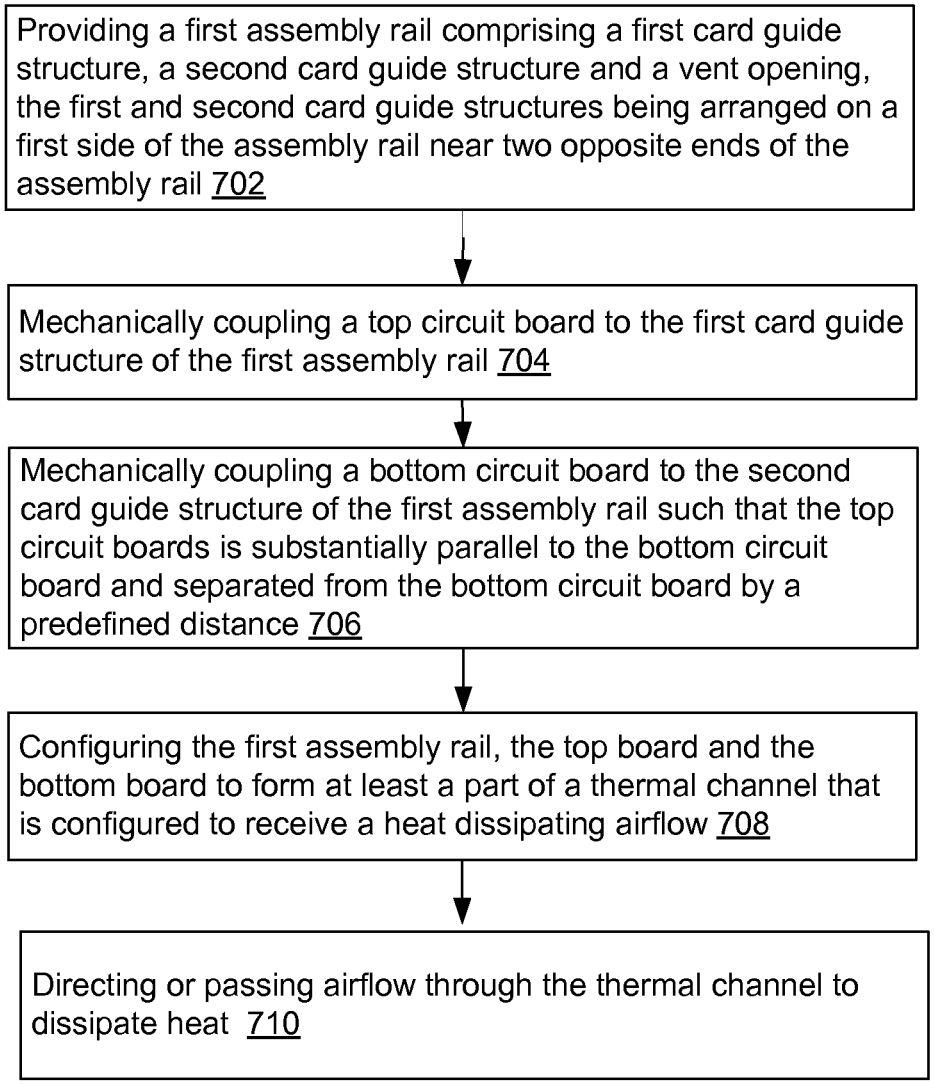
FIG. 7 illustrates an exemplary flow chart of a method for assembling and using an electronic system including a thermal channel in accordance with some embodiments.

FIG. 7 illustrates an exemplary flow chart of a method for assembling and using an electronic system 200 including a channel in accordance with some embodiments. A first assembly rail is provided (702). The first assembly rail includes a first card guide structure, a second card guide structure and a vent opening. The first and second card guide structures are arranged on a first side of the first assembly rail near two opposite edges of the first assembly rail. In some embodiments, the first assembly rail acts as a structural frame to assemble components (e.g., circuit boards and airflow tabs) of the channel thereon. A top circuit board is mechanically coupled (704) to the first card guide structure of the first assembly rail, and a bottom circuit board is mechanically coupled (706) to the second card guide structure of the first assembly rail. The top circuit board is substantially parallel to the top circuit board and separated from the bottom circuit board by a predefined distance. In some embodiments, each of the first and second card guide structures includes a card guide slot where a circuit board is inserted and locked. The first assembly rail, the top circuit board and the bottom circuit board are configured (708) to form at least a part of the thermal channel, and the channel is configured to receive a heat dissipating airflow.

In some embodiments, the channel has an extended length, when the electronic system 200 includes a plurality of assembly rails and a plurality of circuit board sets each further including a top circuit board and a bottom circuit board. Each circuit board set is assembled with an assembly rail to form a duct unit according to operations 702-708. Each circuit board of a duct unit is further coupled to an assembly rail of a neighboring duct unit or another standalone assembly rail at an end of the thermal channel. As such, the extended channel is formed by successively coupling two or more duct units together.

Thereafter, airflow is passed or directed (710) through the channel to dissipate heat, as described above.

More details and examples of the components of the channel (e.g., the circuit boards and the assembly rails) are discussed above with reference to FIGS. 2A-2B, 3A-3D, 4A-4B and 5A-5B.

In accordance with various embodiments of the invention, assembly rails function as structural frames to conveniently assemble a plurality of circuit boards together, and form an electronic assembly including a thermal channel. Such an electronic assembly offers an easy, flexible and inexpensive solution to manufacture and assemble daughter card assemblies that are configured to integrate with a motherboard for many electronic devices. More importantly, airflow is directed through the channel in a controlled manner. When the electronic components of the electronic assembly are placed in accordance with configurations of an interior airflow pathway of the thermal channel, the airflow efficiently carries away the heat generated by these electronic components, maintains a low temperature increase for these electronic components and reduces the thermal expansion of the corresponding circuit boards. In some implementations, heat-sensitive electronic components are isolated from other electronic components, and placed at an upstream location in the interior airflow pathway. Under some circumstances, the heat-sensitive electronic components and other electronic components may have a temperature difference of 20° C. as a result of using the thermal channel.

As noted above, in some embodiments, the electronic assembly 200 or 300 described herein includes one or more memory modules, and in some embodiments, the electronic components of the electronic assembly 200 or 300 include semiconductor memory devices or elements. The semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Furthermore, each type of memory device may have different configurations. For example, flash memory devices may be configured in a NAND or a NOR configuration.

The memory devices can be formed from passive elements, active elements, or both. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles or a charge storage dielectric material.

Multiple memory elements may be configured so that they are connected in series or such that each element is individually accessible. By way of non-limiting example, NAND devices contain memory elements (e.g., devices containing a charge storage region) connected in series. For example, a NAND memory array may be configured so that the array is composed of multiple strings of memory in which each string is composed of multiple memory elements sharing a single bit line and accessed as a group. In contrast, memory elements may be configured so that each element is individually accessible, e.g., a NOR memory array. One of skill in the art will recognize that the NAND and NOR memory configurations are exemplary, and memory elements may be otherwise configured.

The semiconductor memory elements included in a single device, such as memory elements located within and/or over the same substrate or in a single die, may be distributed in a two- or three-dimensional manner (such as a two dimensional (2D) memory array structure or a three dimensional (3D) memory array structure).

In a two dimensional memory structure, the semiconductor memory elements are arranged in a single plane or single memory device level. Typically, in a two dimensional memory structure, memory elements are located in a plane (e.g., in an x-z direction plane) which extends substantially parallel to a major surface of a substrate that supports the memory elements. The substrate may be a wafer on which the material layers of the memory elements are deposited and/or in which memory elements are formed or it may be a carrier substrate which is attached to the memory elements after they are formed.

The memory elements may be arranged in the single memory device level in an ordered array, such as in a plurality of rows and/or columns. However, the memory elements may be arranged in non-regular or non-orthogonal configurations as understood by one of skill in the art. The memory elements may each have two or more electrodes or contact lines, including a bit line and a word line.

A three dimensional memory array is organized so that memory elements occupy multiple planes or multiple device levels, forming a structure in three dimensions (i.e., in the x, y and z directions, where the y direction is substantially perpendicular and the x and z directions are substantially parallel to the major surface of the substrate).

As a non-limiting example, each plane in a three dimensional memory array structure may be physically located in two dimensions (one memory level) with multiple two dimensional memory levels to form a three dimensional memory array structure. As another non-limiting example, a three dimensional memory array may be physically structured as multiple vertical columns (e.g., columns extending substantially perpendicular to the major surface of the substrate in the y direction) having multiple elements in each column and therefore having elements spanning several vertically stacked planes of memory devices. The columns may be arranged in a two dimensional configuration, e.g., in an x-z plane, thereby resulting in a three dimensional arrangement of memory elements. One of skill in the art will understand that other configurations of memory elements in three dimensions will also constitute a three dimensional memory array.

By way of non-limiting example, in a three dimensional NAND memory array, the memory elements may be connected together to form a NAND string within a single plane, sometimes called a horizontal (e.g., x-z) plane for ease of discussion. Alternatively, the memory elements may be connected together to extend through multiple parallel planes. Other three dimensional configurations can be envisioned wherein some NAND strings contain memory elements in a single plane of memory elements (sometimes called a memory level) while other strings contain memory elements which extend through multiple parallel planes (sometimes called parallel memory levels). Three dimensional memory arrays may also be designed in a NOR configuration and in a ReRAM configuration.

A monolithic three dimensional memory array is one in which multiple planes of memory elements (also called multiple memory levels) are formed above and/or within a single substrate, such as a semiconductor wafer, according to a sequence of manufacturing operations. In a monolithic 3D memory array, the material layers forming a respective memory level, such as the topmost memory level, are located on top of the material layers forming an underlying memory level, but on the same single substrate. In some implementations, adjacent memory levels of a monolithic 3D memory array optionally share at least one material layer, while in other implementations adjacent memory levels have intervening material layers separating them.

In contrast, two dimensional memory arrays may be formed separately and then integrated together to form a non-monolithic 3D memory device in a hybrid manner. For example, stacked memories have been constructed by forming 2D memory levels on separate substrates and integrating the formed 2D memory levels atop each other. The substrate of each 2D memory level may be thinned or removed prior to integrating it into a 3D memory device. As the individual memory levels are formed on separate substrates, the resulting 3D memory arrays are not monolithic three dimensional memory arrays.

Further, more than one memory array selected from 2D memory arrays and 3D memory arrays (monolithic or hybrid) may be formed separately and then packaged together to form a stacked-chip memory device. A stacked-chip memory device includes multiple planes or layers of memory devices, sometimes called memory levels.

The term "three-dimensional memory device" (or 3D memory device) is herein defined to mean a memory device having multiple layers or multiple levels (e.g., sometimes called multiple memory levels) of memory elements, including any of the following: a memory device having a monolithic or non-monolithic 3D memory array, some non-limiting examples of which are described above; or two or more 2D and/or 3D memory devices, packaged together to form a stacked-chip memory device, some non-limiting examples of which are described above.

A person skilled in the art will recognize that the invention or inventions descried and claimed herein are not limited to the two dimensional and three dimensional exemplary structures described here, and instead cover all relevant memory structures suitable for implementing the invention or inventions as described herein and as understood by one skilled in the art.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. An electronic assembly, comprising:
   a first assembly rail comprising a first card guide structure, a second card guide structure and a first vent opening between the first guide structure and the second guide structure, the first card guide structure and the second card guide structure being arranged on a first side of the first assembly rail near two opposite ends of the first assembly rail;
   a second assembly rail facing the first side of the first assembly rail, the second assembly rail comprising a third card guide structure, a fourth card guide structure, a fifth card guide structure, a sixth card guide structure and a second vent opening between the third guide structure and the fourth guide structure and between the fifth guide structure and the sixth guide structure, the third card guide structure and the fourth card guide structure being arranged on a first side of the second assembly rail near two opposite ends of the second assembly rail, the fifth card guide structure and the sixth card guide structure being arranged on a second side of the second assembly rail near the two opposite ends of the second assembly rail;
   a first top circuit board having a first end and an opposing second end, the first end and the second end of the first top circuit board are mechanically coupled to the first card guide structure of the first assembly rail and the third card guide structure of the second assembly rail, respectively;
   a first bottom circuit board having a first end and an opposing second end, the first end and the second end of the first bottom circuit board are mechanically coupled to the second card guide structure of the first assembly rail and the fourth card guide structure of the second assembly rail, respectively such that the first top circuit board is substantially parallel to the first bottom circuit board and the first top circuit board is separated from the first bottom circuit board by a predefined distance;
   a second top circuit board having a first end and a second end, the first end of the second top circuit board is mechanically coupled to the fifth card guide structure of the second assembly rail such that the first top circuit board and the second top circuit board are substantially coplanar; and
   a second bottom circuit board having a first end and a second end, the first end of the second bottom circuit board is mechanically coupled to the sixth card guide structure of the second assembly rail such that the first bottom circuit board and the second bottom circuit board are substantially coplanar,
   wherein the first assembly rail, the first top circuit board, and the first bottom circuit board together form a first channel there between for receiving a heat dissipating airflow,
   wherein the second assembly rail, the second top circuit board, and the second bottom circuit board together form a second channel there between for receiving the heat dissipating airflow, and
   wherein the first channel is coupled to the second channel via the second vent opening such that the heat dissipating airflow is directed through the first vent opening, the space between the first top and bottom circuit boards, the second vent opening, and the space between the second top and bottom circuit boards.

2. The electronic assembly of claim 1, wherein each of the first and second card guide structures includes a respective card guide slot, and a respective first end of each of the first top and bottom circuit boards is configured to be inserted and locked into a corresponding card guide slot.

3. The electronic assembly of claim 1, wherein the electronic assembly is mechanically coupled to an external electronic system at an end of the second channel via the second assembly rail.

4. The electronic assembly of claim 1, wherein the electronic assembly is mechanically coupled to an external electronic system using one or more mounting fasteners located at an edge of the first assembly rail.

5. The electronic assembly of claim 1, wherein the first channel further comprises an airflow tab that is coupled to a side of the first channel and includes at least one of a rigid material or a flexible cable.

6. The electronic assembly of claim 1, wherein the first top circuit board and the first bottom circuit board are electronically coupled to each other via a flexible cable that itself contributes to the first channel to further direct the airflow.

7. The electronic assembly of claim 1, wherein the first top circuit board and the first bottom circuit board are electronically coupled to each other via one or more rigid electronic interconnects, where the one or more rigid electronic interconnects act as an airflow tab to direct the airflow.

8. The electronic assembly of claim 1, wherein the first top circuit board and the first bottom circuit board are electronically coupled to each other via one or more rigid electronic interconnects, where the one or more rigid electronic interconnects are located within the first channel and are configured to disturb the airflow.

9. The electronic assembly of claim 1, further comprising a first set of heat-sensitive electronic components mechanically coupled to one of the first top or bottom circuit boards, and a second set of heat-generating electronic components mechanically coupled to the other one of the first top or bottom circuit boards.

10. The electronic assembly of claim 1, further comprising a plurality of temperature-sensitive electronic components coupled to a region of the first top circuit board that is thermally isolated from other regions of the first top circuit board.

11. The electronic assembly of claim 1, wherein the first vent opening is arranged at one side of the first channel.

12. The electronic assembly of claim 1, wherein the first assembly rail widens along a direction of the airflow such that the first vent opening forms a ducted vent opening.

13. The electronic assembly of claim 1, wherein at least one of the first top circuit board and first bottom circuit boards comprises one or more solid state drives (SSDs) or one or more three-dimensional (3D) memory devices.

14. A method for dissipating heat of an electronic assembly, comprising:
provinding a first assembly rail comprising a first card guide structure, a second card guide structure and a first vent opening, the first and second card guide structures being arranged on a first side of the first assembly rail near two opposite ends of the first assembly rail;
providing a second assembly rail facing the first side of the first assembly rail, the second assembly rail comprising a third card guide structure, a fourth card guide structure, a fifth card guide structure, a sixth card guide structure and a second vent opening, the third and fourth card guide structures being arranged on a first side of the second assembly rail near two opposite ends of the second assembly rail, the fifth and sixth card guide structures being arranged on a second side of the second assembly rail near the two opposite ends of the second assembly rail;
providing a first top circuit board, a first bottom circuit board, a second top circuit board, and a second bottom circuit board, each circuit board having a first end and a second end;
mechanically coupling the first end and the second end of the first top circuit board to the first card guide structure of the first assembly rail and the third card guide structure of the second assembly rail, respectively;
mechanically coupling the first end and the second end of the first bottom circuit board to the second card guide structure of the first assembly rail and the fourth card guide structure of the second assembly rail, respectively such that the first top circuit board is substantially parallel to the first bottom circuit board and the first top circuit board is separated from the first bottom circuit board by a predefined distance;
mechanically coupling the first end of the second top circuit board to the fifth card guide structure of the second assembly rail such that the first top circuit board and the second top circuit board are substantially coplanar;
mechanically coupling the first end of the second bottom circuit board to the sixth card guide structure of the second assembly rail such that the first bottom circuit board and the second bottom circuit board are substantially coplanar;
configuring the first assembly rail, the first top circuit board and the first bottom circuit board to form a first channel that is configured to receive a heat dissipating airflow; and
configuring the second assembly rail, the second top circuit board, and the second bottom circuit board to form a second channel that is configured to receive the heat dissipating airflow,
wherein the first channel is coupled to the second channel via the second vent opening such that the heat dissipating airflow is directed through the first vent opening, the space between the first top and bottom circuit boards, the second vent opening, and the space between the second top and bottom circuit boards.

15. The method of claim 14, wherein a plurality of temperature-sensitive electronic components are coupled to a region of the first top circuit board, the region of the first top circuit board is thermally isolated from other regions of the first top circuit board.

16. The method of claim 14, wherein the first assembly rail is extended and widened along a direction of the airflow on at least one side of the first assembly rail such that the first vent opening forms a ducted vent opening.

17. The method of claim 14, further comprising directing airflow through a space formed between the first top circuit board and the first bottom circuit board to dissipate heat.

18. The method of claim 14, wherein at least one of the first top circuit board and the first bottom circuit boards comprises one or more solid state drives (SSDs) or one or more three-dimensional (3D) memory devices.

19. An electronic assembly, comprising:
a plurality of assembly rails that are arranged substantially in parallel, each assembly rail comprising a respective vent opening, a respective front side and a respective back side, each side of the respective assembly rail further comprising a respective first card guide structure and a respective second card guide structure that are arranged near two opposite ends of the assembly rail; and
a plurality of circuit board sets each comprising a top circuit board and a bottom circuit board, each top circuit board and bottom circuit having a first end and a second end, the first end and the second end of the top circuit board and the first end and the second end of the bottom circuit board being mechanically coupled between the first card guide structures and between the second card guide structures on two respective sides of two adjacent assembly rails, respectively, wherein the two respective sides face each other, the top and bottom circuit boards being substantially parallel to each other and separated by a predefined distance, the top circuit boards in the plurality of circuit board sets being substantially coplanar, the bottom circuit boards in the plurality of circuit board sets being substantially coplanar;
wherein the plurality of assembly rails alternate with the plurality of circuit board sets and each assembly rail and each circuit board set adjacent thereto together form a channel there between for receiving a heat dissipating airflow,
wherein each channel is coupled to each other via the respective vent opening such that the heat dissipating airflow is directed alternately through each vent opening and the space between the top and bottom circuits of each circuit board set.

20. The electronic assembly of claim 19, wherein at least one of the plurality of assembly rails is extended and widened along a direction of the airflow on at least one side of the at least one assembly rail to form a ducted vent opening.

* * * * *